United States Patent
Son et al.

(10) Patent No.: US 12,342,576 B2
(45) Date of Patent: Jun. 24, 2025

(54) SEMICONDUCTOR DEVICES

(71) Applicant: SAMSUNG ELECTRONICS CO., LTD., Suwon-si (KR)

(72) Inventors: Jinkyung Son, Suwon-si (KR); Seungje Kim, Suwon-si (KR); Jiwon Park, Seoul (KR); Jaepo Lim, Seoul (KR); Minseok Jo, Suwon-si (KR); Seunghyun Lim, Seoul (KR); Jinyoung Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 495 days.

(21) Appl. No.: 17/896,523

(22) Filed: Aug. 26, 2022

(65) Prior Publication Data

US 2023/0187519 A1   Jun. 15, 2023

(30) Foreign Application Priority Data

Dec. 9, 2021  (KR) .......................... 10-2021-0175333

(51) Int. Cl.
*H10D 30/67* (2025.01)
*H10D 30/01* (2025.01)
*H10D 30/43* (2025.01)
*H10D 62/10* (2025.01)
*H10D 62/13* (2025.01)
*H10D 64/01* (2025.01)

(52) U.S. Cl.
CPC ....... *H10D 30/6735* (2025.01); *H10D 30/014* (2025.01); *H10D 30/031* (2025.01); *H10D 30/43* (2025.01); *H10D 30/6757* (2025.01); *H10D 62/121* (2025.01); *H10D 62/151* (2025.01); *H10D 64/017* (2025.01); *H10D 64/018* (2025.01)

(58) Field of Classification Search
CPC ............. H10D 30/6735; H10D 30/014; H10D 30/6757; H10D 64/018; H10D 64/017; H10D 62/121; H10D 62/151
See application file for complete search history.

(56) References Cited

U.S. PATENT DOCUMENTS

| 9,941,377 | B2 | | 4/2018 | Yang et al. |
| 10,892,331 | B2 | * | 1/2021 | Yamashita ............. H10D 30/62 |
| 11,018,050 | B2 | * | 5/2021 | Kim ..................... H10D 30/024 |

(Continued)

FOREIGN PATENT DOCUMENTS

KR   10-0971419 B1   7/2010

*Primary Examiner* — Mark W Tornow
(74) *Attorney, Agent, or Firm* — Sughrue Mion, PLLC

(57) ABSTRACT

A semiconductor device is provided. The semiconductor device includes: a substrate with an active region extending in a first direction; an element isolation layer, adjacent to the active region, in the substrate; a gate electrode on the substrate and extending in a second direction which crosses the first direction; a plurality of channel layers on the active region, spaced apart from each other along a third direction perpendicular to an upper surface of the substrate, and surrounded by the gate electrode; and a source/drain region provided in a recess of the active region adjacent to the gate electrode, and connected to the plurality of channel layers. In the first direction, the gate electrode has a first length on the active region and a second length, greater than the first length, on the element isolation layer.

20 Claims, 23 Drawing Sheets

(56) References Cited

U.S. PATENT DOCUMENTS

| | | |
|---|---|---|
| 2017/0141112 A1 | 5/2017 | Ching et al. |
| 2018/0175214 A1* | 6/2018 | Chen .................. H10D 30/0321 |
| 2020/0027895 A1* | 1/2020 | Cho .................. H10D 84/0193 |
| 2020/0403064 A1 | 12/2020 | Baek et al. |
| 2021/0257499 A1 | 8/2021 | Shin et al. |

* cited by examiner

SEMICONDUCTOR DEVICES

CROSS-REFERENCE TO RELATED APPLICATION(S)

This application claims priority from Korean Patent Application No. 10-2021-0175333, filed on Dec. 9, 2021, in the Korean Intellectual Property Office, the disclosure of which is incorporated herein by reference in its entirety.

BACKGROUND

The present disclosure relates to semiconductor devices.

There is a need for semiconductor devices with higher integration in order to meet increasing demand for a semiconductor device having a high performance, high speed and/or multifunctionality. In this regard, a semiconductor device may be required to implement a fine pattern with reduced separation distances between patterns. In addition, there is a need for a semiconductor device including a fin field-effect transistor (FinFET) having a three-dimensional channel structure which allows for complete removal of sacrificial layers to overcome a limitation of an operating characteristic caused by a reduced size of a planar metal oxide semiconductor field effect transistor (FET).

SUMMARY

Example embodiments provide a semiconductor device having improved reliability.

According to example embodiments, a semiconductor device includes: a substrate with an active region extending in a first direction; an element isolation layer, adjacent to the active region, in the substrate; a gate electrode on the substrate and extending in a second direction which crosses the first direction; a plurality of channel layers on the active region, spaced apart from each other along a third direction perpendicular to an upper surface of the substrate, and surrounded by the gate electrode; and a source/drain region provided in a recess of the active region adjacent to the gate electrode, and connected to the plurality of channel layers. In the first direction, the gate electrode has a first length on the active region and a second length, greater than the first length, on the element isolation layer.

According to example embodiments, a semiconductor device includes: a substrate with an active region extending in a first direction; an element isolation layer, adjacent to the active region, in the substrate; a gate electrode on the substrate and extending in a second direction which crosses the first direction; a plurality of channel layers on the active region, spaced apart from each other along a third direction perpendicular to an upper surface of the substrate, and surrounded by the gate electrode. In a plan view, the gate electrode has a convex side surface in a region in which the gate electrode overlaps the element isolation layer.

According to example embodiments, a semiconductor device includes: a substrate with an active region extending in a first direction; a first gate structure on the substrate and extending in a second direction which crosses the first direction; a second gate structure on the substrate and extending in the second direction; a plurality of channel layers on the active region, spaced apart from each other along a third direction perpendicular to an upper surface of the substrate, and surrounded by each of the first gate structure and the second gate structure; and a source/drain region on the active region between the first gate structure and the second gate structure, and connected to the plurality of channel layers. In the first direction, the first gate structure has a first length on the plurality of channel layers, and a second length, greater than the first length, on the outside of the plurality of channel layers.

BRIEF DESCRIPTION OF DRAWINGS

The above and other aspects will be more apparent from the following description of example embodiments taken in conjunction with the accompanying drawings, in which.

DETAILED DESCRIPTION

Hereinafter, example embodiments will be described with reference to the accompanying drawings. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
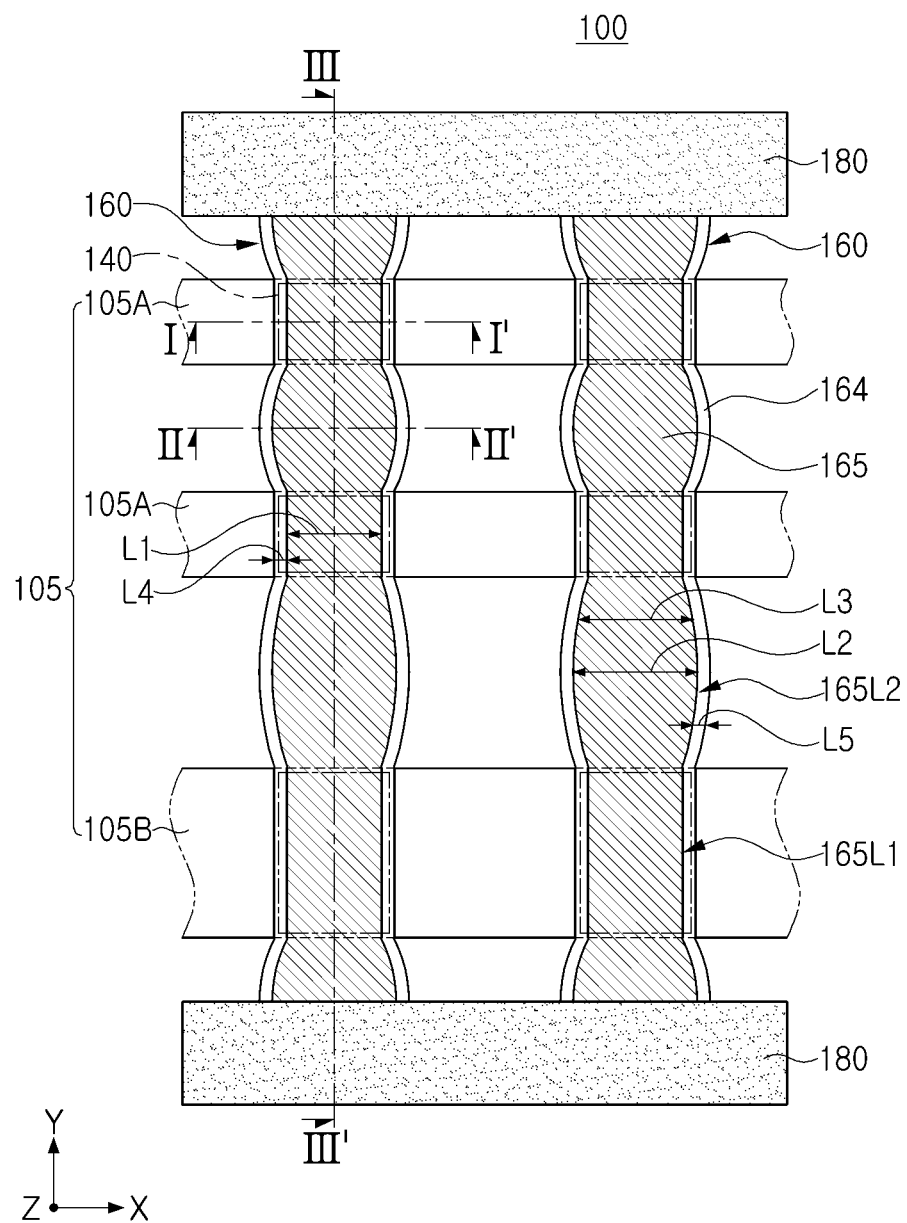
FIG. 1 is a plan view showing a semiconductor device according to example embodiments.

FIG. 1 is a plan view showing a semiconductor device according to example embodiments.

Figure 2A:
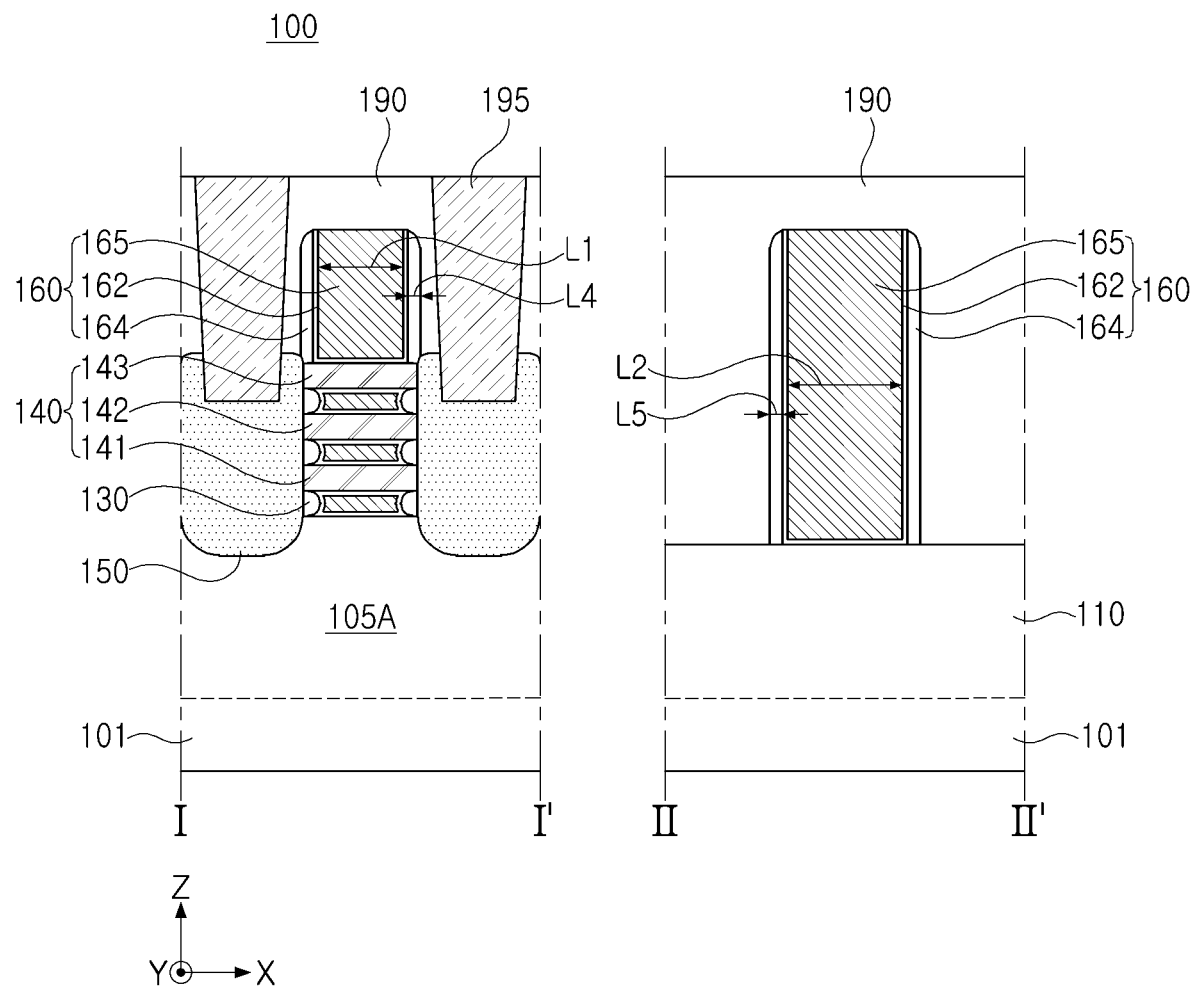
FIGS. 2A and 2B are cross-sectional views each showing the semiconductor devices according to example embodiments.
Figure 2B:
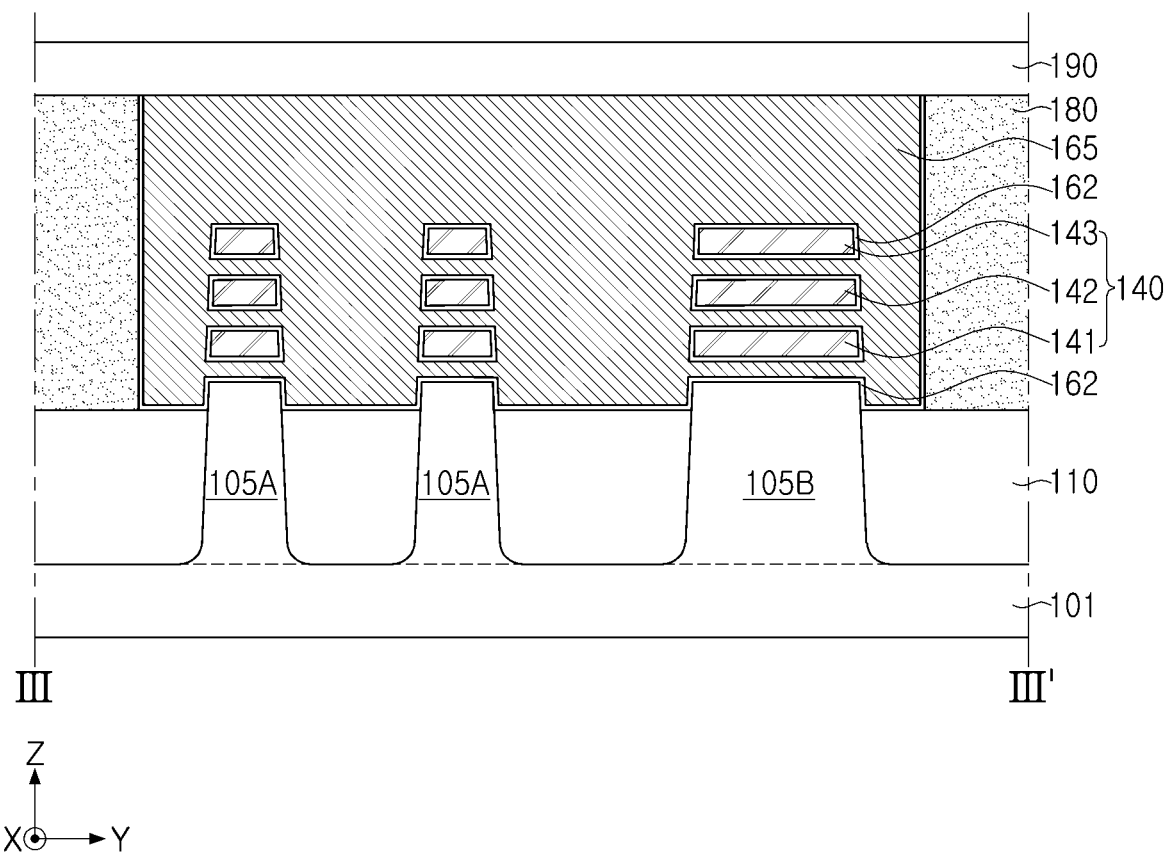

FIGS. 2A and 2B are cross-sectional views each showing the semiconductor devices according to example embodiments. FIG. 2A shows cross-sections of the semiconductor device of FIG. 1 taken along cutting lines I-I' and II-II', and FIG. 2B shows a cross-section of the semiconductor device of FIG. 1 taken along cutting line III-III'. For convenience of description, FIG. 1 shows only some components of the semiconductor device, and omits some components such as an element isolation layer 110 and a gate dielectric layer 162.

Referring to FIGS. 1 through 2B, a semiconductor device 100 may include a substrate 101 including active regions 105, channel structures 140 including first to third channel layers 141, 142 and 143 which are disposed on the active regions 105 and vertically spaced apart from one another, gate structures 160 which intersect the active regions 105 and include gate electrodes 165, source/drain regions 150 in contact with channel structures 140, and contact plugs 195 connected to the source/drain regions 150. The semiconductor device 100 may further include the element isolation layer 110, internal spacer layers 130, the gate dielectric layers 162, gate spacer layers 164, gate separation layers 180 and an interlayer insulation layer 190.

In the semiconductor device 100, the active region 105 may have a fin structure, and the gate electrodes 165 may be disposed between the active region 105 and the channel structures 140, between the first to third channel layers 141, 142 and 143 of the channel structures 140, and on the channel structures 140. Accordingly, the semiconductor device 100 may include transistors each having a gate-all-around field effect transistor such as a multi-bridge channel FET (MBCFET™) structure.

The substrate 101 may have an upper surface which extends along an X-direction and a Y-direction. The substrate 101 may include a semiconductor material, for example, a group IV semiconductor, a group III-V compound semiconductor, or a group II-VI compound semiconductor. For example, the group IV semiconductor may include silicon, germanium or silicon-germanium. The substrate 101 may be provided as a bulk wafer, an epitaxial layer, a silicon-on-insulator (SOI) layer, a semiconductor on insulator (SeOI) layer or the like.

The substrate 101 may include the active regions 105 disposed in an upper portion thereof. The active regions 105 may be defined from the element isolation layer 110 in the substrate 101. The active regions 105 may extend in a first direction, for example, the X-direction. However, example embodiments are not limited thereto, and the active regions 105 may be separate from the substrate 101. The active region 105 may partially protrude through the element isolation layer 110, and an upper surface of the active region 105 may thus be positioned at a higher level than an upper surface of the element isolation layer 110. The active regions 105 may include first and second active regions 105A and 105B having lengths different from each other in the Y-direction. According to example embodiments, widths and dispositions of the active regions 105 may be variously changed. The active regions 105 may be formed as a portion of the substrate 101, or may include an epitaxial layer grown from the substrate 101. However, the active region 105 may be partially recessed in at sides of the gate structure 160 to form a recessed region, and the source/drain region 150 may be disposed in the recessed region.

In example embodiments, the active region 105 may or may not include a well region including impurities. For example, in a case of a p-type transistor (pFET), the well region may include n-type impurities such as phosphorus (P), arsenic (As) or antimony (Sb), and in a case of an n-type transistor (nFET), the well region may include p-type impurities such as boron (B), gallium (Ga) or aluminum (Al). The well region may be positioned, for example, at a predetermined depth from the upper surface of the active region 105.

The element isolation layer 110 may define the active regions 105 in the substrate 101. The element isolation layer 110 may be formed by, for example, a shallow trench isolation (STI) process. In some example embodiments, the element isolation layer 110 may further include a region having a step below the substrate 101, and may have a lower surface below the substrate 101. The element isolation layer 110 may expose or partially expose the upper surfaces of the active regions 105. In some example embodiments, the element isolation layer 110 may have an upper surface which curves toward the active region 105. The element isolation layer 110 may be made of an insulating material. The element isolation layer 110 may be, for example, oxide, nitride or a combination thereof.

The channel structures 140 may be disposed on the active regions 105, in regions where the active regions 105 intersect the gate structures 160. The channel structures 140 may not extend onto the element isolation layer 110, and may be positioned only on the active regions 105. The channel structures 140 may entirely overlap the active regions 105 and the gate structures 160 along a Z-direction. Each of the channel structures 140 may include the first to third channel layers 141, 142 and 143, which are two or more channel layers spaced apart from each other along the Z-direction. The channel structure 140 may be connected to the source/drain regions 150. The channel structure 140 may have the same or smaller width as the active region 105 in the Y-direction, and may have the same or similar width as the gate structure 160 in the X-direction. In some example embodiments, the channel structure 140 may have a reduced width and side surfaces may be positioned below the gate structures 160 in the X-direction.

The channel structures 140 may be made of a semiconductor material, and may include, for example, at least one of silicon (Si), silicon germanium (SiGe) and germanium (Ge). The channel structure 140 may be formed of, for example, the same material as the substrate 101. In some example embodiments, the channel structure 140 may include an impurity region positioned adjacent to the source/drain region 150. The number and shape of the channel layers included in one channel structure 140 may be variously changed in example embodiments. For example, in some example embodiments, the channel structure 140 may further include a channel layer disposed below a lowermost region of the gate electrode 165.

The source/drain region 150 may be disposed in the recessed region partially recessed from an upper portion of the active region 105, on sides of the gate structure 160. The source/drain region 150 may be provided on, and for example may cover, each side of the first to third channel layers 141, 142 and 143 of the channel structures 140. An upper surface of the source/drain region 150 may be positioned at the same or a similar height as a lower surface of an uppermost region of the gate electrode 165, and the height may be variously changed in example embodiments. The source/drain region 150 may include impurities.

The gate structure 160 may intersect the active region 105 and the channel structure 140 on the active region 105 and the channel structures 140. The gate structure 160 may extend in a second direction, for example, the Y-direction. A functional channel region of the transistor may be formed in the active region 105 and/or the channel structure 140, intersecting the gate electrode 165 of the gate structure 160. The gate structure 160 may include a gate electrode 165, a gate dielectric layer 162 disposed between the gate electrode 165 and the first to third channel layers 141, 142 and 143, and the gate spacer layer 164 disposed on a side surface of the gate electrode 165. In example embodiments, the gate structure 160 may further include a capping layer disposed on an upper surface of the gate electrode 165. Alternatively, a portion of the interlayer insulation layer 190 disposed on the gate structure 160 may be referred to as a gate capping layer.

The gate dielectric layer 162 may be disposed between the active region 105 and the gate electrode 165, and between the channel structure 140 and the gate electrode 165, and for example may cover at least some surfaces of the gate electrode 165. For example, the gate dielectric layer 162 may surround all the surfaces of the gate electrode 165 except for its upper surface. The gate dielectric layer 162 may extend between the gate electrode 165 and the spacer layer 164, and is not limited thereto. The gate dielectric layer 162 may include oxide, nitride or a high-k material. The high-k material may refer to a dielectric material having a higher dielectric constant than that of a silicon oxide layer ($SiO_2$). The high-k material may be, for example, at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$) and praseodymium oxide ($Pr_2O_3$). According to example embodiments, the gate dielectric layer 162 may be formed of a multilayer film.

The gate electrode 165 may fill a space between the first to third channel layers 141, 142 and 143 on the active region 105 and may extend onto the channel structure 140. The gate electrode 165 may be spaced apart from the first to third channel layers 141, 142 and 143 by the gate dielectric layer 162. The gate electrode 165 may include a conductive material, and may include, for example, a metal nitride such as titanium nitride (TiN), tantalum nitride (TaN) or tungsten nitride (WN), a metal material such as aluminum (Al), tungsten (W) or molybdenum (Mo), and/or a semiconductor material such as doped polysilicon. According to example embodiments, the gate electrode 165 may be formed of two or more multilayers.

The gate spacer layer 164 may be disposed on side surfaces of the gate electrode 165 and on the channel structure 140. The gate spacer layer 164 may insulate the source/drain region 150 and the gate electrode 165 from each other. The gate spacer layer 164 may have a multilayer structure according to example embodiments. The gate spacer layer 164 may be formed of oxide, nitride or oxynitride, and in particular, may be formed of a low-k film.

As shown in FIG. 1, the gate electrode 165 and the gate structure 160 including the gate electrode 165 may include regions having lengths different from each other in the X-direction. The gate electrode 165 may have a first length L1 on the active region 105 and the channel structure 140, and may have a second length L2, greater than the first length L1, on the element isolation layer 110. The gate electrode 165 may have the first length L1 in a region in which the gate electrode 165 overlaps the active region 105 and the channel structure 140 in the Z-direction, and may have the second length L2, greater than the first length L1, in a region in which the gate electrode 165 overlaps the element isolation layer 110 in the Z-direction and does not overlap the channel structure 140 in the Z-direction. In this specification, a "length" may indicate at least one of a length, an average length, a maximum length and a minimum length in one region, unless otherwise specified.

For example, the second length L2 may be in a range of about 1.1 times to about 1.3 times the first length L1. In a case in which the second length L2 is in a range smaller than the above range, the sacrificial layers 120 described below with reference to FIGS. 11A and 11B may not be sufficiently removed when manufacturing the semiconductor device 100. In a case in which the second length L2 is in a range greater than the above range, a distance between the adjacent gate structures 160 may be relatively short, which may increase difficulty in a manufacturing process of the semiconductor device. In example embodiments, the first length L1 may range, for example, from about 3 nm to about 20 nm.

As shown in FIG. 1, the gate electrode 165 may have symmetrical left and right sides in the X-direction. The gate electrode 165 may have the first length L1 substantially constant on the active region 105. The gate electrode 165 may include a plurality of regions where the gate electrode 165 has the plurality of lengths on the element isolation layer 110. For example, the gate electrode 165 may have the second length L2 as its maximum length, and may further have a third length L3 which is smaller than the second length L2 and greater than the first length L1. In this example embodiment, even the minimum length of the gate electrode 165 on the element isolation layer 110 may be greater than the first length L1. The gate electrode 165 may not overlap the active region 105 in the Z-direction in a region in which the gate electrode 165 has the length greater than the first length L1.

The gate electrode 165 may have the length on the element isolation layer 110 in the X-direction, which may be increased and then reduced again between the adjacent active regions 105 in the Y-direction. Accordingly, the gate electrode 165 may have a line-shaped first side surface 165L1 which extends on the active region 105 in the Y-direction and a second side surface 165L2 convex outward from its center on the element isolation layer 110. A boundary between the first side surface 165L1 and the second side surface 165L2 may be positioned on a boundary between the active region 105 and the element isolation layer 110. The convex shape of the second side surface 165L2 may be variously changed in example embodiments.

The gate spacer layers 164 may have substantially the same lengths in the X-direction and may extend in the Y-direction. The gate spacer layer 164 may have a fourth length L4 on the active region 105 and a fifth length L5, which is substantially equal to the fourth length L4, on the element isolation layer 110. The gate dielectric layer 162 may have a constant thickness on the active region 105 and the element isolation layer 110. However, a length of the gate dielectric layer 162 on the channel structure 140 in the X-direction may have the same tendency as that of the gate electrode 165. Accordingly, the length of the gate dielectric layer 162 on the channel structure 140 in the X-direction may be greater on the element isolation layer 110 than on the active region 105. Accordingly, an overall length of the gate structure 160 in the X-direction may be greater on the element isolation layer 110 than on the active region 105.

In this example embodiment, the gate electrode 165 may have the constant length on the active region 105 to maintain an electrical characteristic of the transistor, and may have a relatively greater length on the element isolation layer 110, which may prevent a defect from occurring when manufacturing the semiconductor device 100. This is described in more detail with reference to FIGS. 11A and 11B below.

The internal spacer layer 130 may be disposed between the first to third channel layers 141, 142 and 143 in the Z-direction, and may extend in parallel with the gate electrode 165. The gate electrode 165 may be stably spaced apart from the source/drain region 150 by the internal spacer layer 130, and therefore may be electrically isolated from the source/drain region 150. The internal spacer layer 130 may have a side surface facing the gate electrode 165, which is convexly rounded toward the gate electrode 165, and is not limited thereto. The internal spacer layer 130 may be formed of oxide, nitride or oxynitride, and in particular, may be formed of the low-k film.

According to example embodiments, the internal spacer layer 130 may be omitted. In this case, the source/drain region 150 may be expanded in a region in which the internal spacer layer 130 are disposed, or the gate electrode 165 and the gate dielectric layer 162 may be expanded in the X-direction.

The gate separation layer 180 may be disposed on sides of the gate structure 160 in the Y-direction. The gate separation layer 180 may be disposed between adjacent to gate structures 160 in the Y-direction to separate the gate structures 160 from each other. A lower surface of the gate separation layer 180 may be in contact with the element isolation layer 110. According to example embodiments, side surfaces of the gate separation layer 180 may be perpendicular to the upper surface of the substrate 101 or inclined to have a width which narrows toward its lower portion. The side surface of the gate separation layer 180 facing the gate structure 160 may be provided on, and for example may be covered by, the gate dielectric layer 162. However, example embodiments are not limited thereto. In some example embodiments, the side surfaces of the gate separation layer 180 may be provided on, and for example may be covered by, the gate dielectric layer 162 and the gate electrode 165 disposed on the gate dielectric layer 162.

The gate separation layer 180 may include an insulating material. The gate separation layer 180 may include, for example, at least one of silicon oxide, silicon nitride, silicon oxynitride and silicon carbide. The gate separation layer 180 may be formed of a single insulating layer or a structure in which the plurality of insulating layers are stacked on each other.

The contact plug 195 may penetrate through the interlayer insulation layer 190 to be connected to the source/drain region 150, and may conduct an electrical signal to the source/drain region 150. The contact plug 195 may have an inclined side surface, and a width a lower portion of the contact plug 195 may be narrower than a width of an upper portion of the contact plug 195 based on an aspect ratio, and is not limited thereto. The contact plug 195 may extend from the upper portion, for example, below a lower surface of the third channel layer 143 disposed on a topmost portion of each of the channel structures 140, and is not limited thereto. In example embodiments, the upper surface of the source/drain region 150 may be substantially flat (i.e., may not be recessed), and the contact plug 195 may be in contact with the upper surface of the source/drain region 150.

The contact plug 195 may include a metal silicide layer, which may be positioned at the bottom end of the contact plug 195, including the lower surface, and may further include a barrier layer disposed on the upper surface of the metal silicide layer and sidewalls. The barrier layer may include, for example, metal nitride such as a titanium nitride layer (TiN), a tantalum nitride layer (TaN) or a tungsten nitride layer (WN). The contact plug 195 may include, for example, a metal material such as aluminum (Al), tungsten (W) or molybdenum (Mo). In example embodiments, the number and dispositions of the conductive layers included in the contact plug 195 may be variously changed. In addition, an interconnection structure such as the contact plug may be further disposed on the gate electrode 165, and an interconnection structure connected to the contact plug 195 may be further disposed on the contact plug 195.

The interlayer insulation layer 190 may be provided on, and for example may cover, the source/drain region 150 and the gate structure 160, as well as the element isolation layer 110. The interlayer insulation layer 190 may include at least one of oxide, nitride and oxynitride, and may include, for example, the low-k material. According to example embodiments, the interlayer insulation layer 190 may include a plurality of insulating layers.

Hereinafter, a description overlapping the description described above with reference to FIGS. 1 through 2B will not be repeated.

FIGS. 3A through 3D are schematic plan views showing semiconductor devices according to example embodiments. FIGS. 3A through 3D each show a region corresponding to the region of FIG. 1.

Figure 3A:
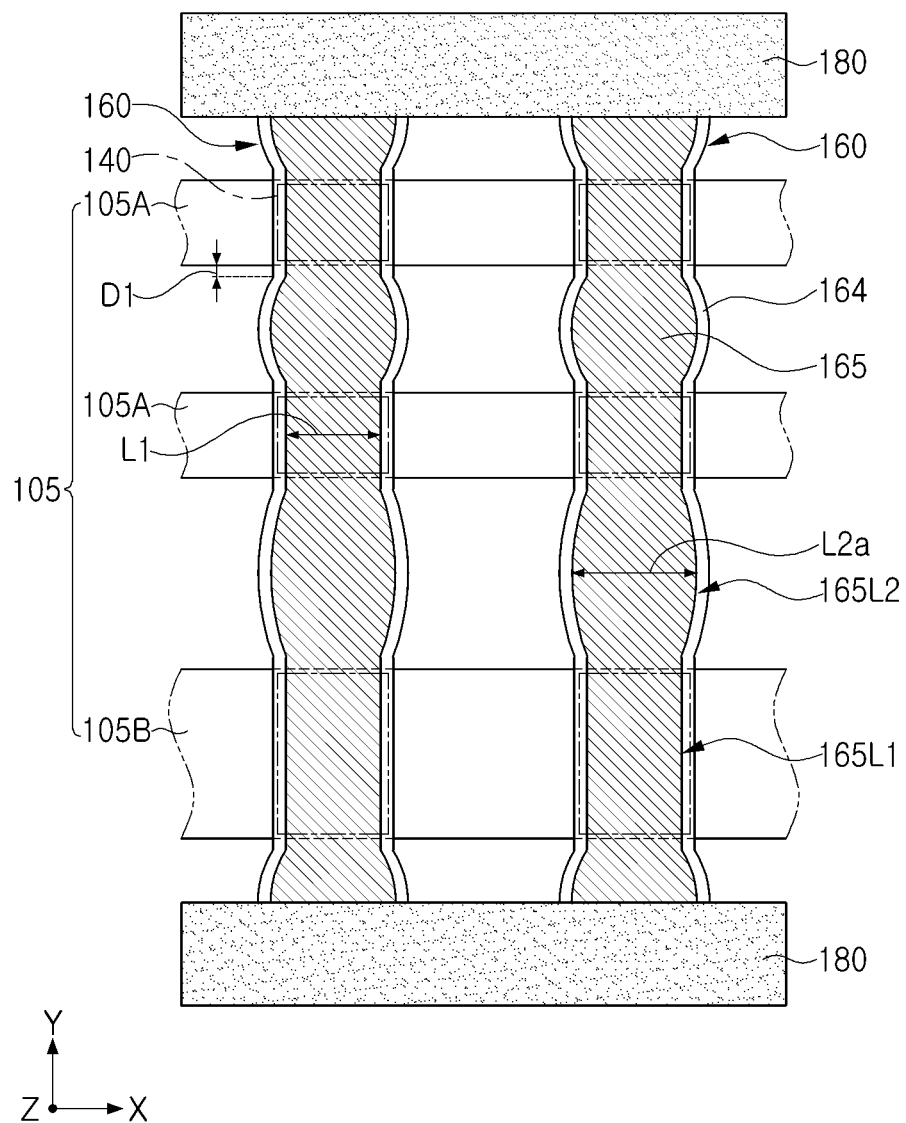
FIGS. 3A, 3B, 3C and 3D are schematic plan views showing semiconductor devices according to example embodiments.

Referring to FIG. 3A, in a semiconductor device 100a, the boundary between the first side surface 165L1 and the second side surface 165L2 may be positioned on the element isolation layer 110 and spaced apart from the boundary between the active region 105 and the element isolation layer 110. The boundary between the first side surface 165L1 and the second side surface 165L2 may be a point where a width of the gate electrode 165 changes from be constant to being variable. A distance D1 may be variously changed in example embodiments, at which the boundary between the first side surface 165L1 and the second side surface 165L2 are spaced apart from the boundary between the active region 105 and the element isolation layer 110 toward the outside of the active region 105. The gate electrode 165 may have the first length L1 on the active region 105 and a second length L2a, greater than the first length L1, on the element isolation layer 110.

Due to this structure, a length of the transistor in the semiconductor device 100a may be maintained even when a process deviation occurs during the manufacturing process of the semiconductor device 100a, thus stably securing a characteristic of the semiconductor device 100a.

Figure 3B:
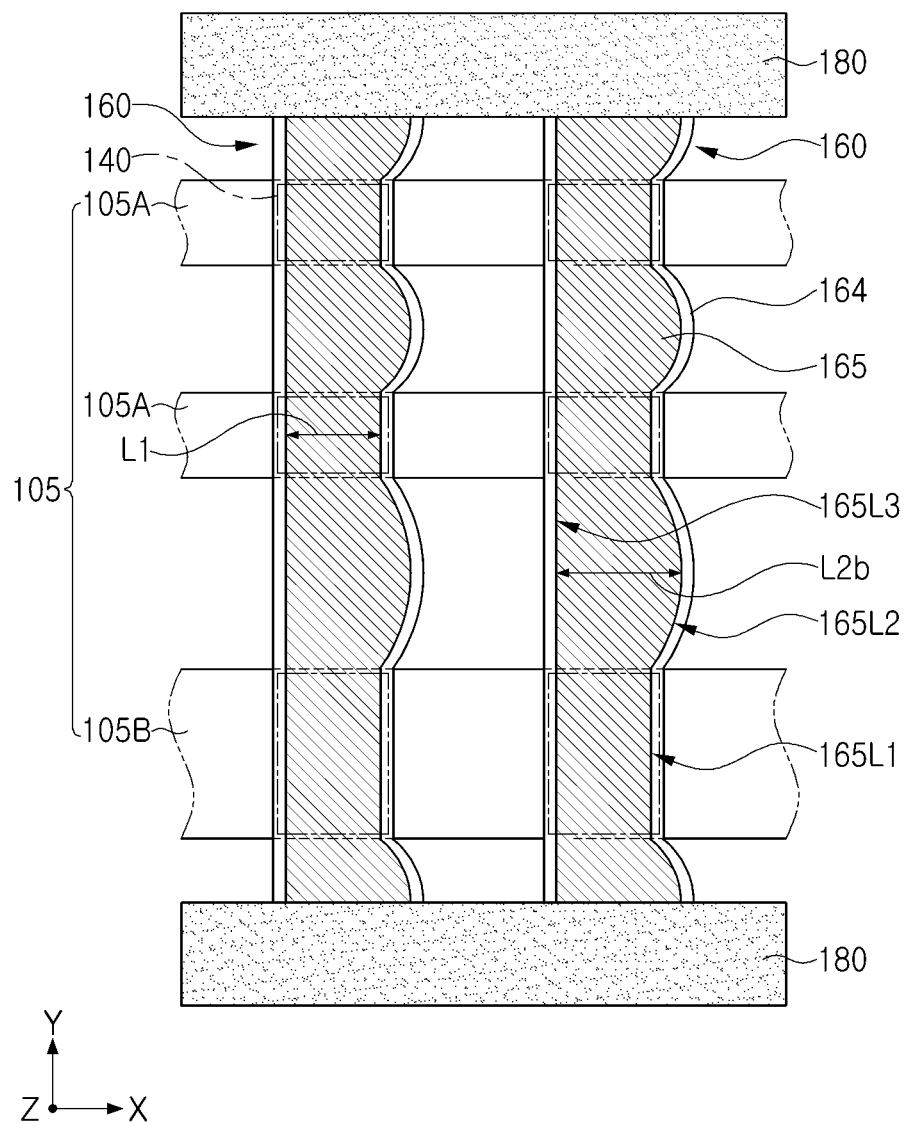

Referring to FIG. 3B, in a semiconductor device 100b, each of the gate structure 160 and the gate electrode 165 may have asymmetrical left and right sides in the X-direction. One side surface of the gate electrode 165 in the X-direction may include the line-shaped first side surface 165L1 and the convex-shaped second side surface 165L2, and the other side surface of the gate electrode 165 in the X-direction may include a line-shaped third side surface 165L3. The gate electrode 165 may have the first length L1 on the active region 105 and a second length L2b, greater than the first length L1, on the element isolation layer 110.

FIG. 3B shows that two gate electrodes 165 having the same shape as described above are disposed parallel to each other, and example embodiments are not limited thereto. For example, the gate electrode 165 of this type may be disposed in at least one region of the semiconductor device 100b in consideration of a layout of the semiconductor device 100b such as dispositions of the adjacent gate structure 160 and the contact plug 195.

Figure 3C:
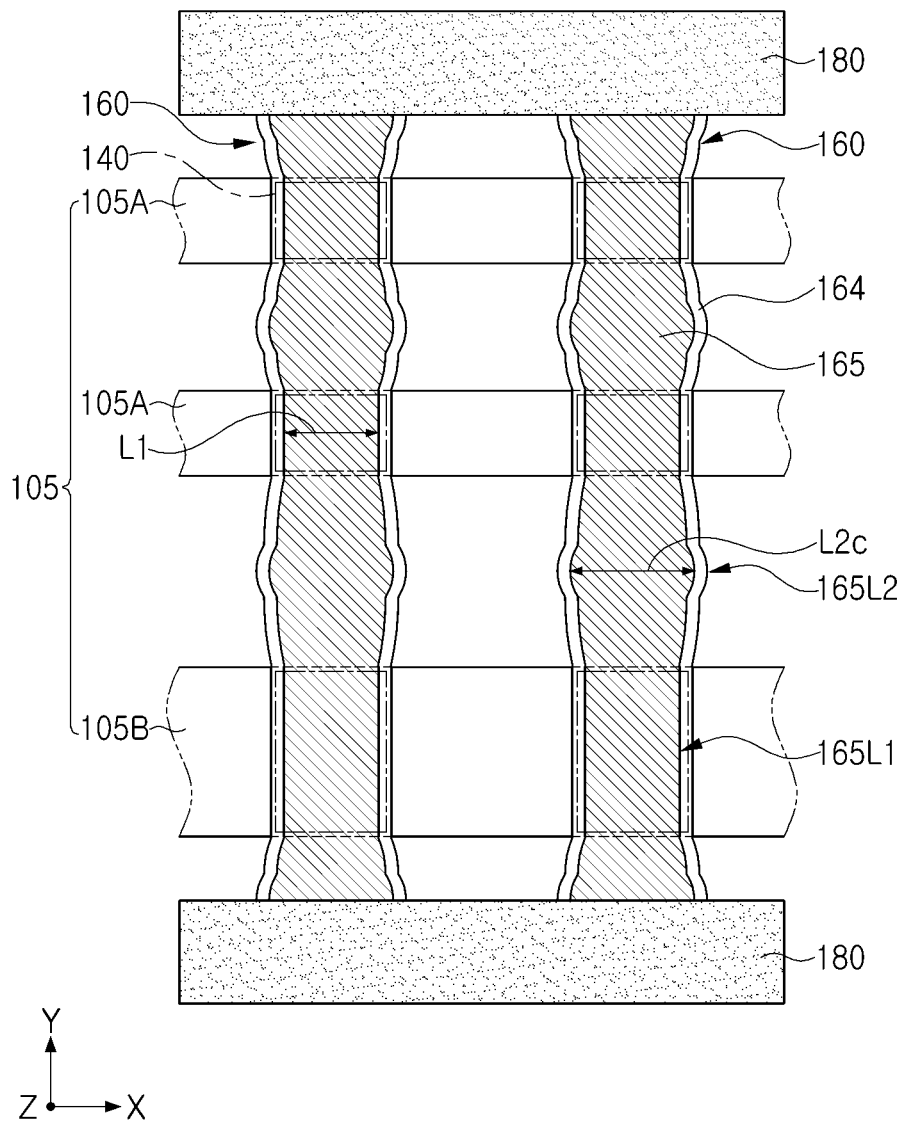

Referring to FIG. 3C, in a semiconductor device 100c, each of second side surfaces 165L2 of the gate electrode 165 may have the outwardly convex shape and further have a curvature change point. For example, the second side surface 165L2 may entirely have a convex shape. The convex shape may include three regions, a first region provided adjacent to a first active region 105, a second region adjacent to a second active region 105, and a third region between the first and second regions. The first and second regions may have a similar curvature. The third region may include have a curvature that is greater than that of the first and second regions. The third region may protrude farther outward from its central region than the first and second regions. The gate electrode 165 may have the first length L1 on the active region 105 and a second length L2c, greater than the first length L1, on the element isolation layer 110. This shape of the gate electrode 165 may be formed as a mask pattern for forming the gate electrode 165 on the element isolation layer 110 to have its width increased in a step shape. According to example embodiments, the second side surface 165L2 may have a step shape in which the width is increased by three or more steps toward its center between the adjacent active regions 105, or may have a rounded step shape.

Figure 3D:
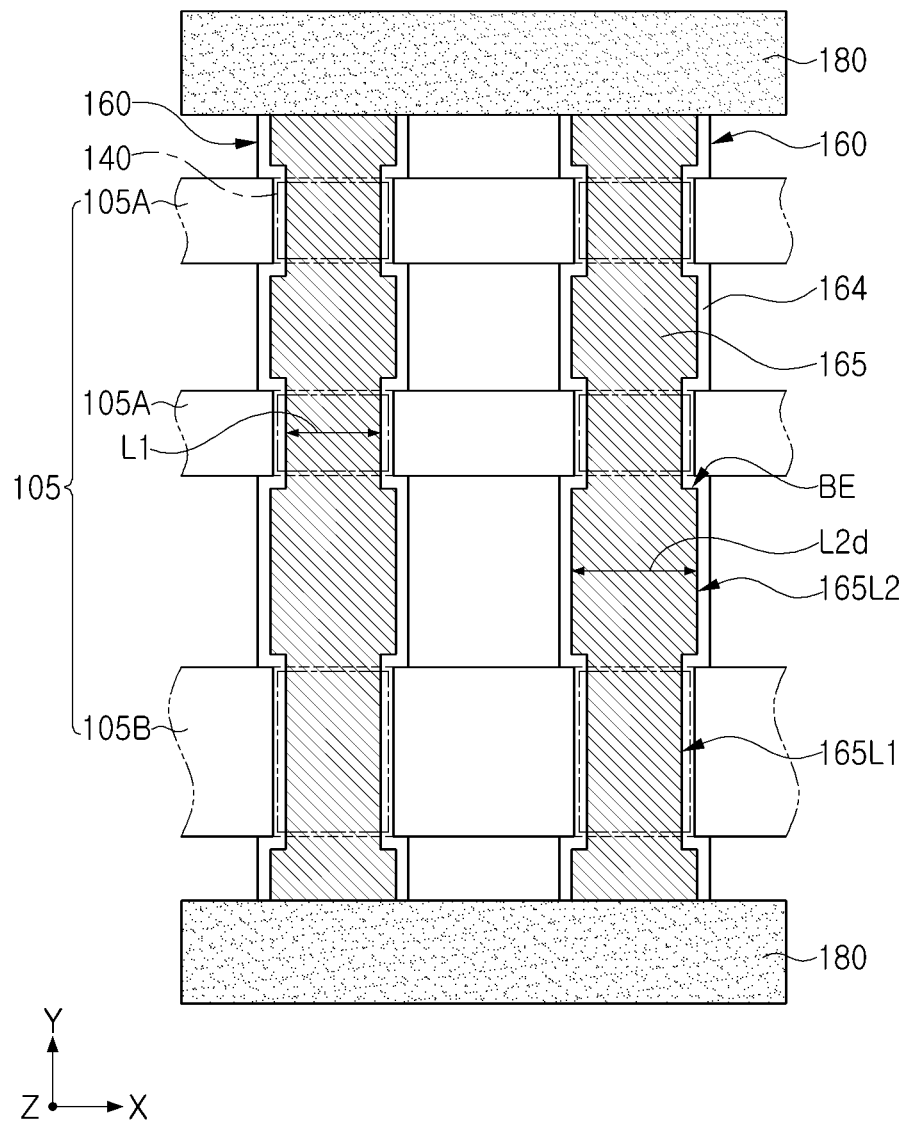

Referring to FIG. 3D, in a semiconductor device 100d, the second side surface 165L2 of the gate electrode 165 may have a line shape which extends in the Y-direction, and the gate electrode 165 may have a bent portion BE formed between the first side surface 165L1 and the second side surface 165L2. In some example embodiments, the bent portion BE may have a rounded corner. The bent portion BE may be positioned on the boundary between the active region 105 and the element isolation layer 110. In some example embodiments, the bent portion BE may be positioned on the element isolation layer 110. The gate electrodes 165 may have the first length L1 on the active region 105 and a second length L2d, greater than the first length L1, on the element isolation layer 110.

Figure 4:
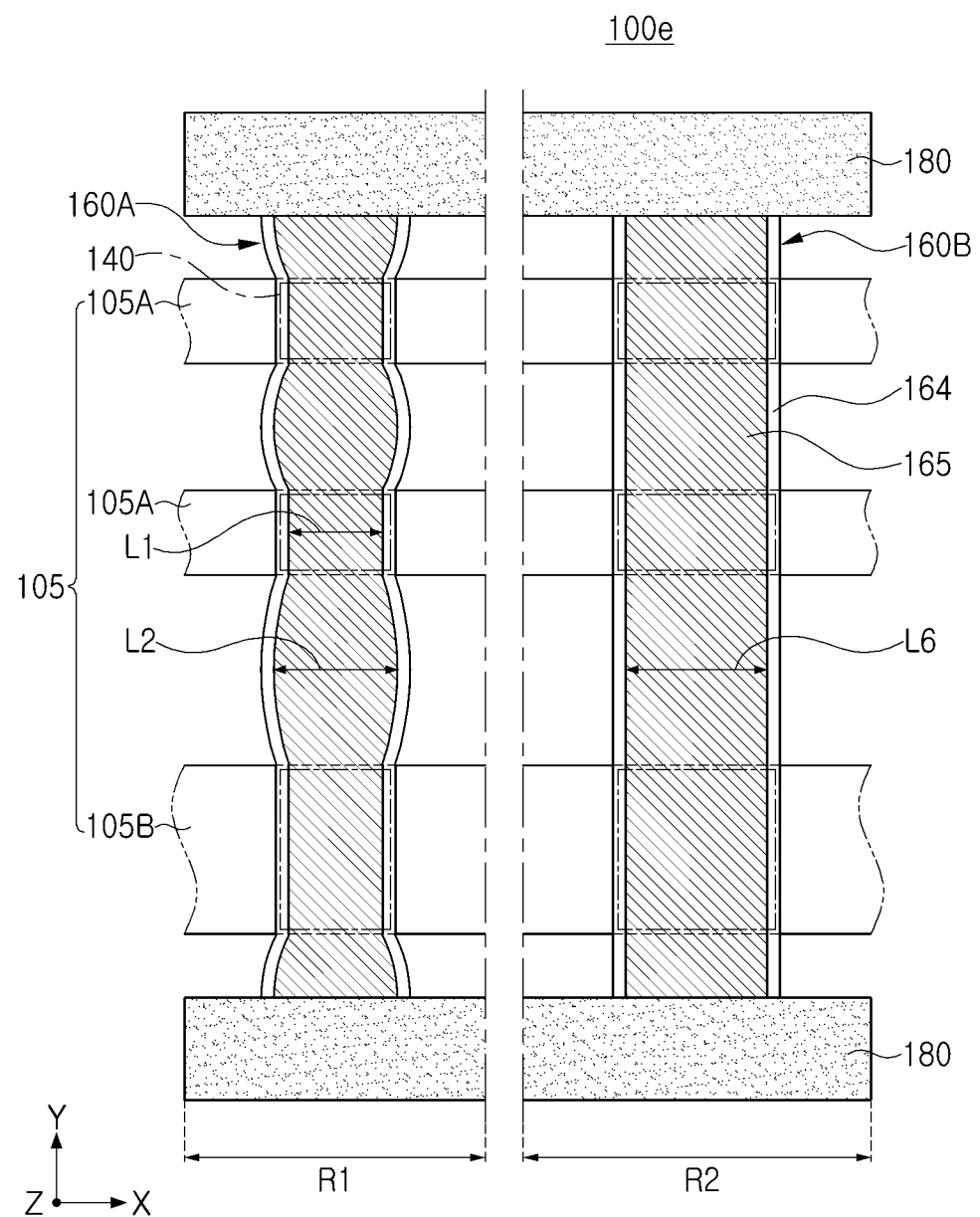
FIG. 4 is a schematic plan view showing a semiconductor device according to example embodiments.

FIG. 4 is a schematic plan view showing a semiconductor device according to example embodiments.

Referring to FIG. 4, a semiconductor device 100e may include first and second regions R1 and R2, and include first and second gate structures 160A and 160B having different shapes and respectively disposed in the first and second regions R1 and R2. The first and second regions R1 and R2 may be adjacent to each other or spaced apart from each other.

In the first region R1, the first gate structure 160A and the gate electrode 165 of the first gate structure 160A may have the same shape as that described above with reference to FIGS. 1 through 2B. In detail, in the first region R1, the gate electrode 165 may have the first length L1 on the active region 105 and the second length L2, greater than the first length L1, on the element isolation layer 110.

In the second region R2, the second gate structure 160B and the gate electrode 165 of the second gate structure 160B may have shapes different from that of the first gate structure 160A in the first region R1. In the second region R2, the gate electrode 165 may have a constant sixth length L6 in the X-direction and may extend in the Y-direction. The sixth length L6 may be, for example, greater than the second length L2, and is not limited thereto.

In this example embodiment, the semiconductor device 100e may be manufactured in such a manner that a gate structure has the same shape as the first gate structure 160A of the first region R1 when the length of the gate electrode 165 is less than or equal to a predetermined length, and the a gate structure has the same shape as the second gate structure 160B of the second region R2 when the length of the gate electrode 165 is greater than the predetermined length. In this case, it is possible to secure a process margin for forming the first gate structure 160A having a relatively small length.

FIGS. 5A through 10B are views of a manufacturing method of a semiconductor device according to example embodiments. FIGS. 5A through 10B show an example embodiment of the manufacturing method of manufacturing the semiconductor device shown in FIGS. 1 through 2B, and show cross-sections corresponding to those shown in FIGS. 2A and 2B.

Figure 11A:
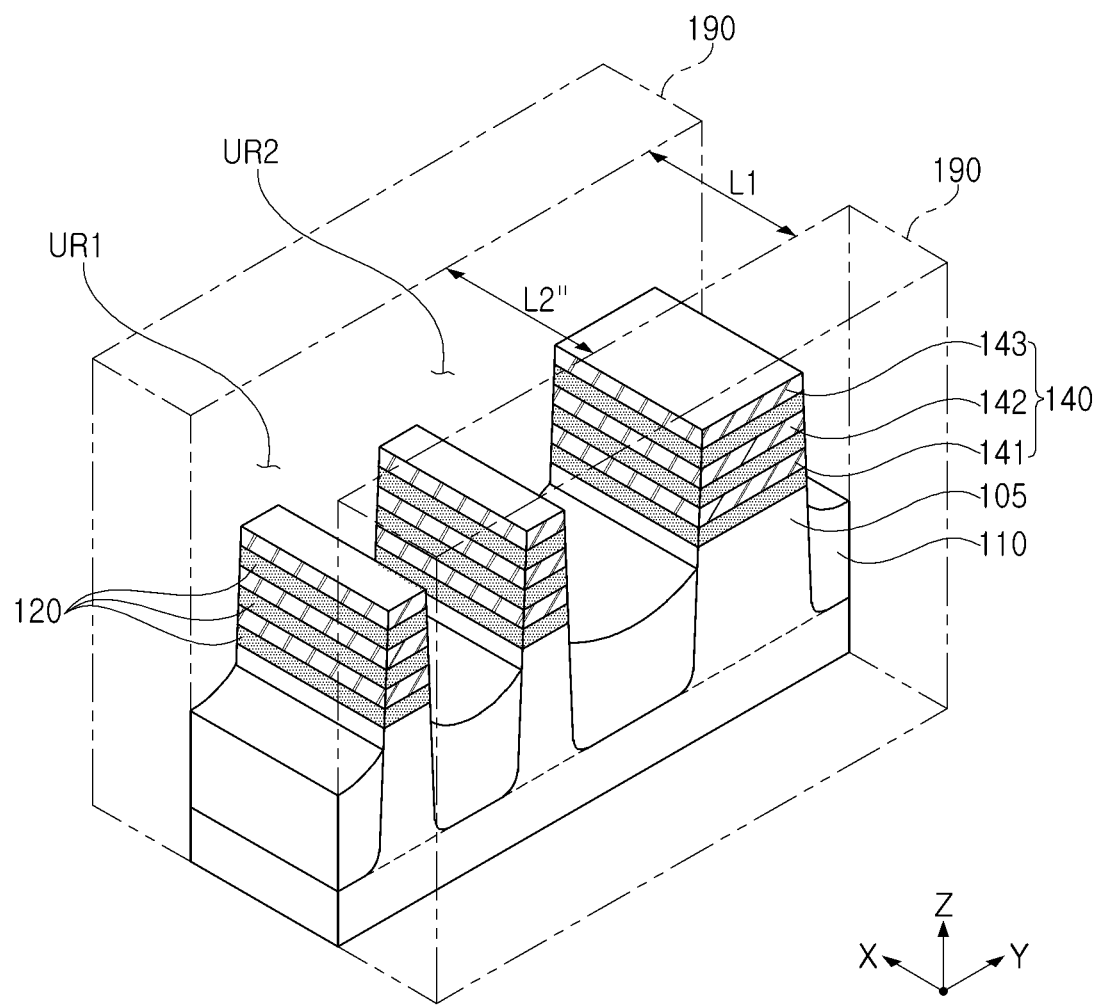
FIGS. 11A and 11B are views of a manufacturing method of the semiconductor device according to example embodiments.
Figure 11B:
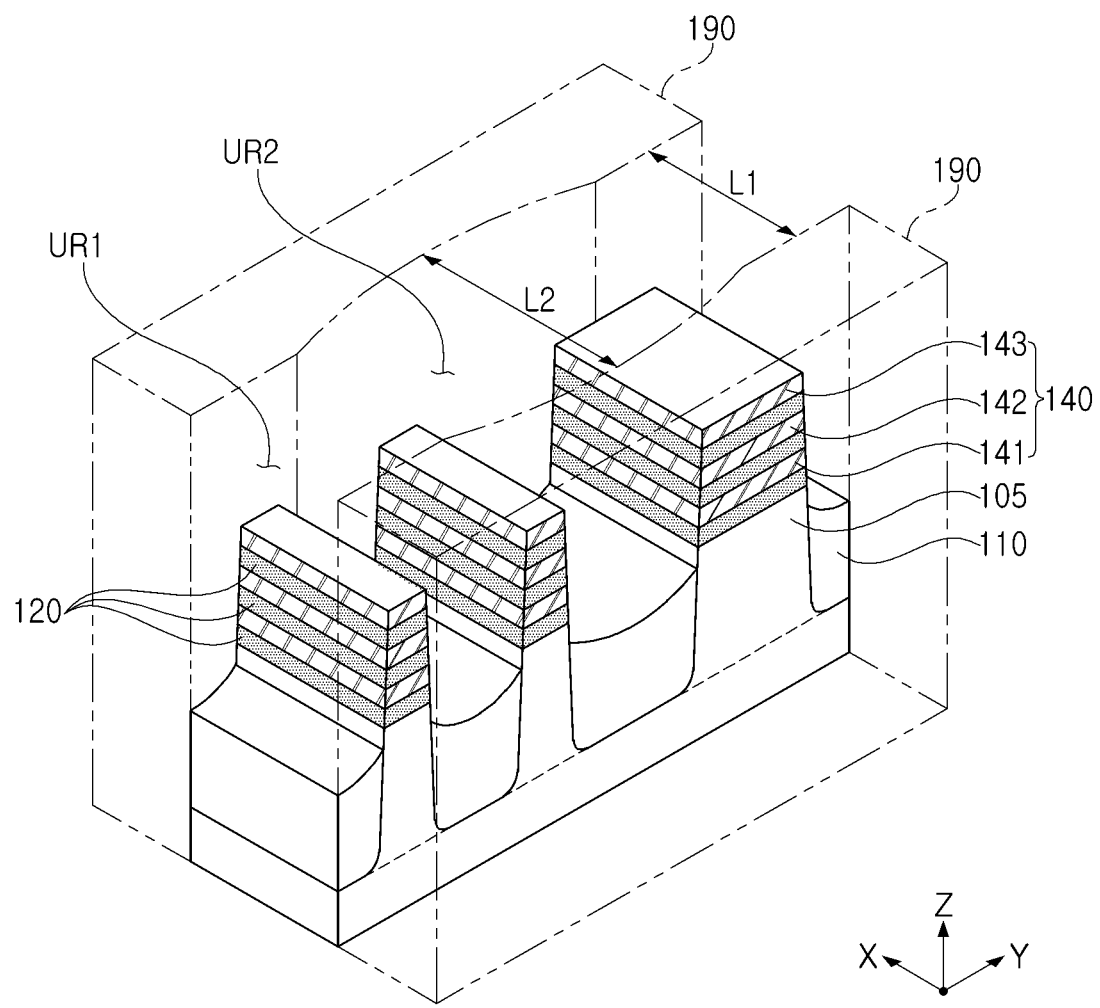

FIGS. 11A and 11B are views of a manufacturing method of the semiconductor device according to example embodiments.

Figure 5A:
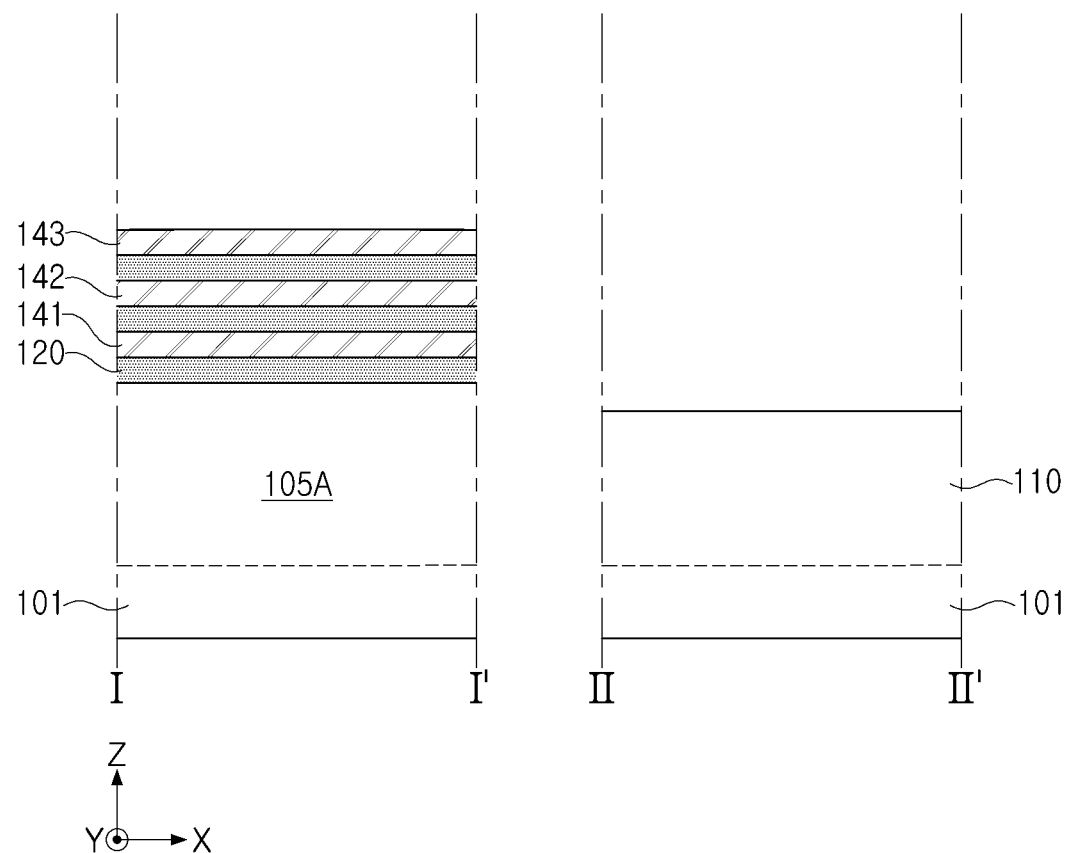
FIGS. 5A, 5B, 6A, 6B, 7A, 7B, 8A, 8B, 9A, 9B, 10A and 10B are views of a manufacturing method of a semiconductor device according to example embodiments.
Figure 5B:
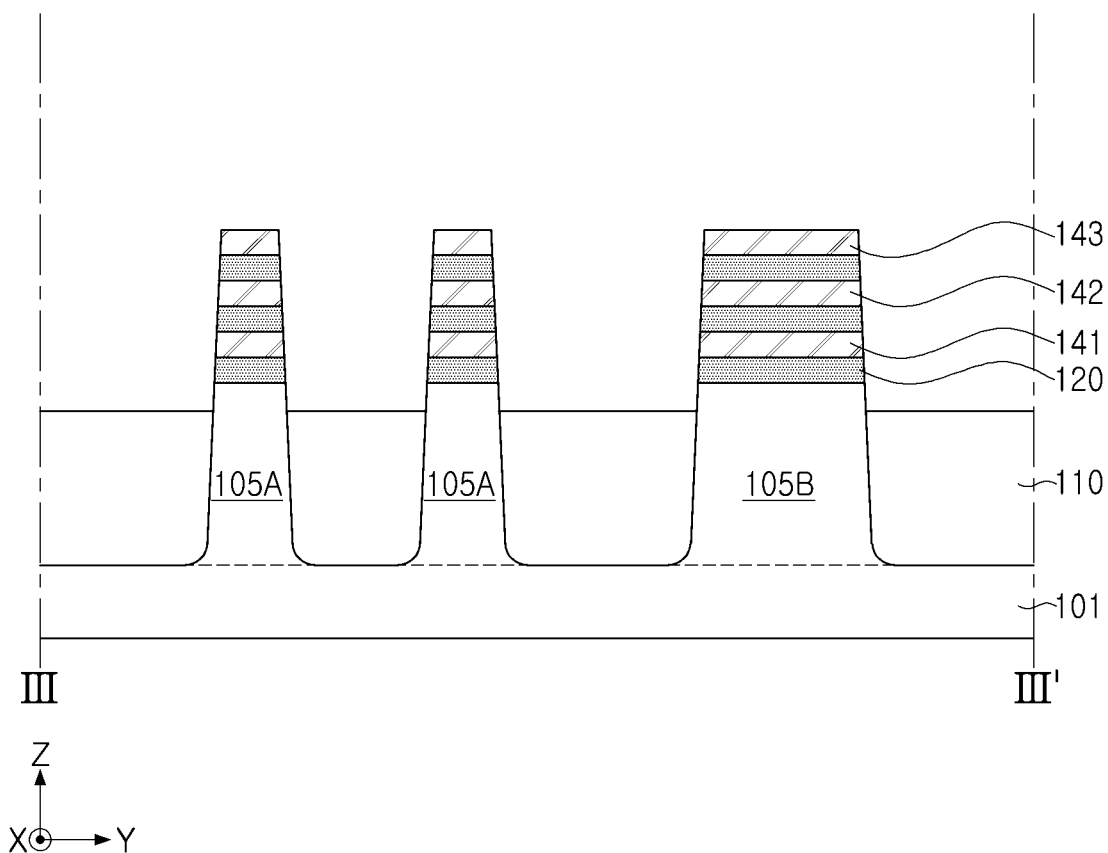

Referring to FIGS. 5A and 5B, sacrificial layers 120 and the first to third channel layers 141, 142 and 143 may be alternately stacked on the substrate 101 to form an active structure.

The sacrificial layers 120 may be replaced by the gate dielectric layer 162 and the gate electrode 165 below the third channel layer 143 by a subsequent process, in order to obtain the semiconductor device 100 shown in FIGS. 2A and 2B. The sacrificial layer 120 may be made of a material having etching selectivity with respect to each of the first to third channel layers 141, 142 and 143. The first to third channel layers 141, 142 and 143 may include a material different from that of the sacrificial layer 120. The sacrificial layer 120 and the first to third channel layers 141, 142 and 143 may include, for example, the semiconductor material including at least one of silicon (Si), silicon germanium (SiGe), and germanium (Ge), may include different materials, and may or may not include the impurities. For example, the sacrificial layer 120 may include silicon germanium (SiGe), and the first to third channel layers 141, 142 and 143 may include silicon (Si).

The sacrificial layer 120 and the first to third channel layers 141, 142 and 143 may be formed by performing an epitaxial growth process from the substrate 101. Each of the sacrificial layer 120 and the first to third channel layers 141, 142 and 143 may have a thickness in a range of about 1 Å to about 100 nm. The number of layers of the channel layers 141, 142 and 143 alternately stacked on the sacrificial layers 120 may be variously changed in example embodiments.

Next, the active structure may be formed by patterning the sacrificial layers 120, the first to third channel layers 141, 142 and 143, and a top region of the substrate 101. The active structure may include the sacrificial layers 120 and the first to third channel layers 141, 142 and 143 alternately stacked on each other, and may further include the active region 105 formed by removing a portion of the substrate 101. Thus, the active structure may protrude from the substrate 101. The active structures may each have a shape of a line extending in one direction, for example, the X-direction, and may be spaced apart from each other along the Y-direction. The active structure may have an inclined side surface to have a width which increases toward its lower portion based on an aspect ratio.

In a region from which the substrate 101 is partially removed, for example between the active structures 105, the element isolation layer 110 may be formed by burying the insulating material and then partially removing the insulating material so that the active region 105 protrudes from the element isolation layer 110. The upper surface of the element isolation layer 110 may be lower than the upper surface of the active region 105.

Figure 6A:
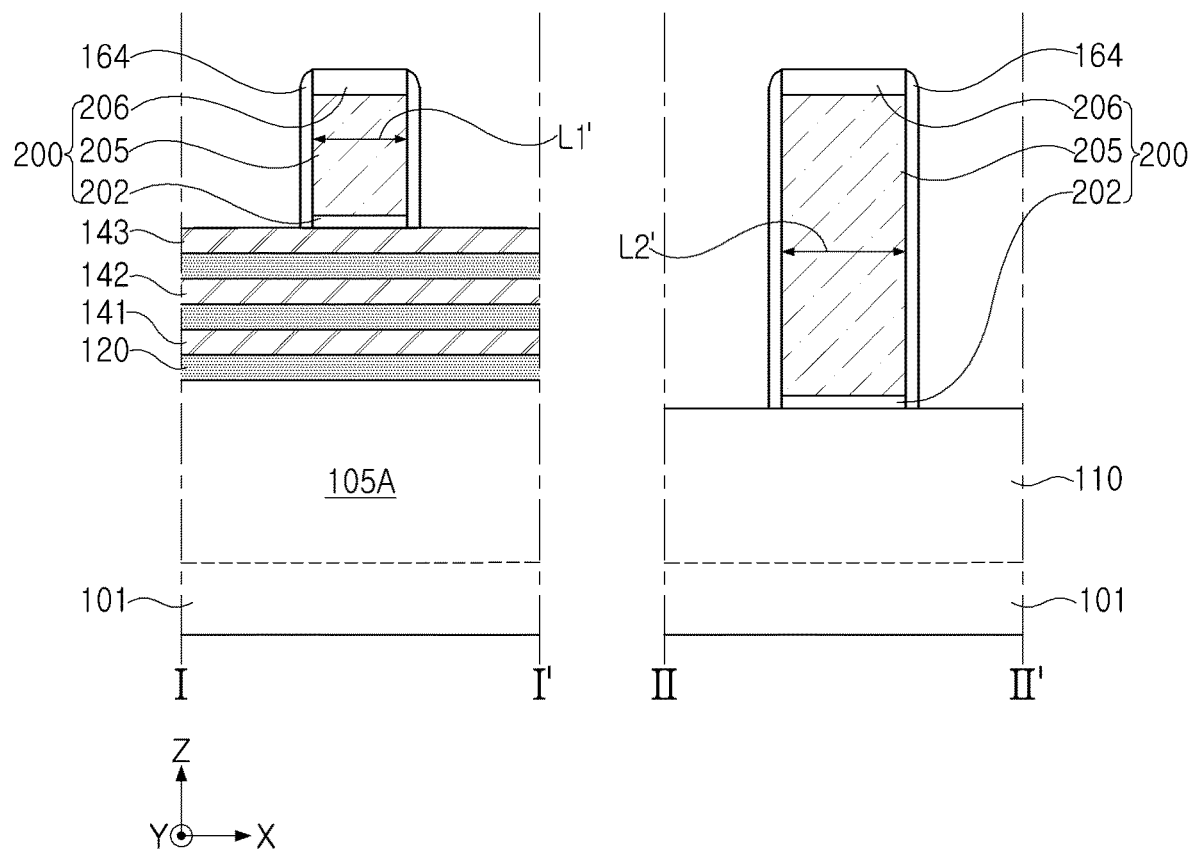
Figure 6B:
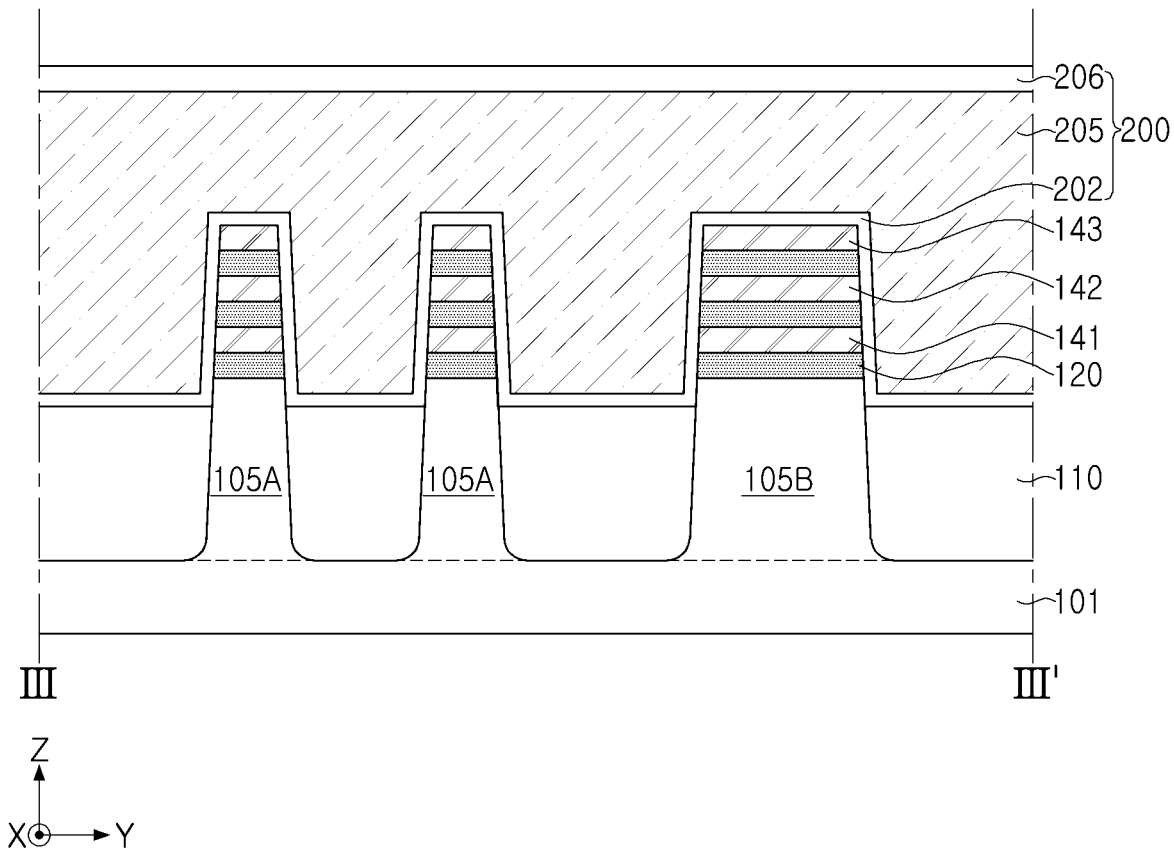

Referring to FIG. 6A and FIG. 6B, a sacrificial gate structure 200 and the gate spacer layers 164 may be formed on the active structure.

The sacrificial gate structure 200 may be a sacrificial structure formed in a region in which the gate dielectric layer 162 and the gate electrode 165 are disposed on the channel structure 140 by a subsequent process. The sacrificial gate structure 200 may include first and second sacrificial gate layers 202 and 205 and a mask pattern layer 206, which are sequentially stacked on each other. The first and second sacrificial gate layers 202 and 205 may be patterned using the mask pattern layer 206. The first and second sacrificial gate layers 202 and 205 may respectively be an insulating layer and a conductive layer, and are not limited thereto, and the first and second sacrificial gate layers 202 and 205 may be formed as one layer. For example, the first sacrificial gate layer 202 may include silicon oxide, and the second sacrificial gate layer 205 may include polysilicon. The mask pattern layer 206 may include silicon oxide and/or silicon nitride.

The sacrificial gate structure 200 may have a shape of a line which extends in one direction to intersect the active structure. The sacrificial gate structure 200 may extend in, for example, the Y-direction, and may be spaced apart from the adjacent sacrificial gate structure 200 along the X-direction. The sacrificial gate structure 200 may have a shape corresponding to that of the gate electrode 165 of FIG. 1. Accordingly, the sacrificial gate structure 200 may have a shape corresponding to that of the gate electrode 165 of FIG. 1 in a plan view of the semiconductor device. The sacrificial gate structure 200 may have the first length L1' on the active region 105 in the X-direction and the second length L2', greater than the first length L1', on the element isolation layer 110 in the X-direction.

The gate spacer layer 164 may be formed on sidewalls of the sacrificial gate structure 200. The gate spacer layer 164 may be made of the low-k material, and may include, for example, at least one of silicon monoxide (SiO), silicon nitride (SiN), silicon carbonitride (SiCN), silicon oxide (SiOC), silicon oxynitride (SiON) and silicon oxycarbonitride (SiOCN).

Figure 7A:
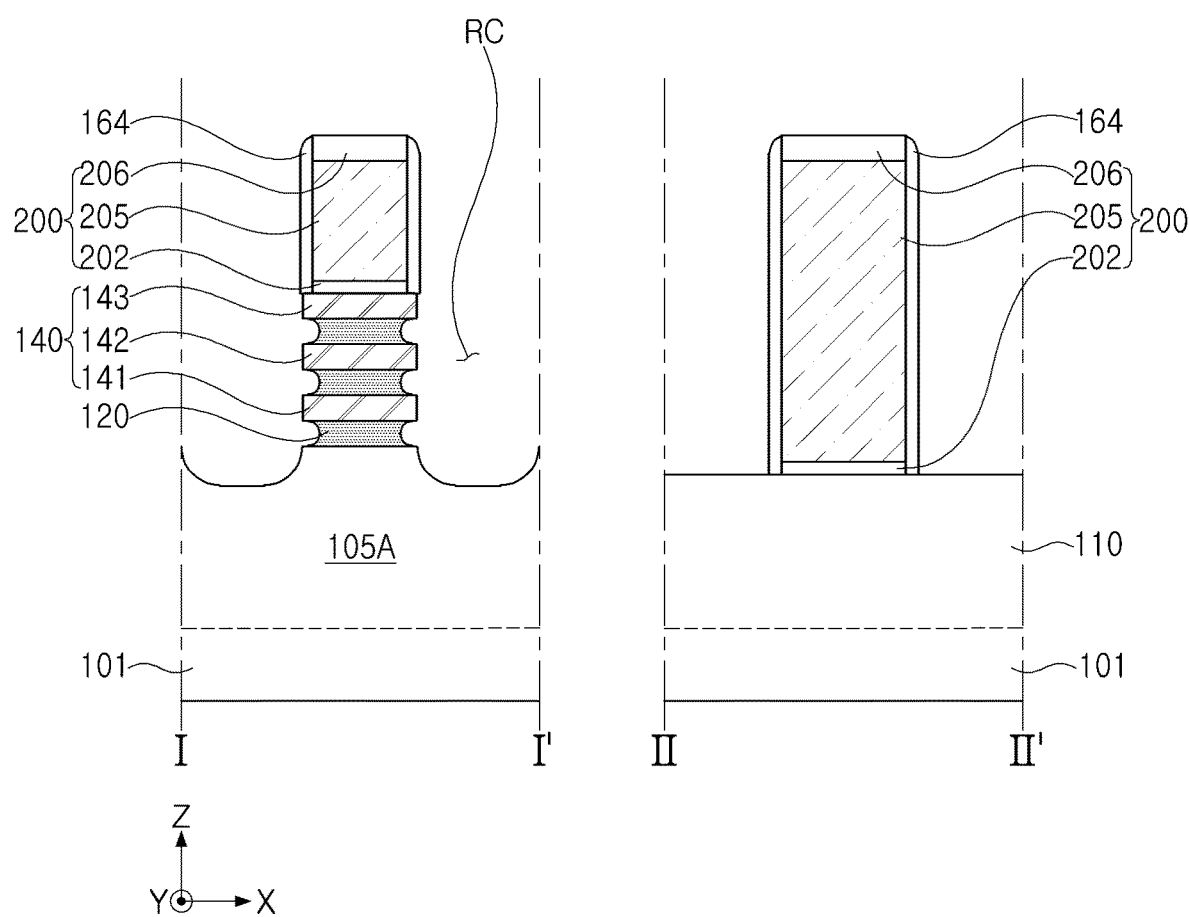
Figure 7B:
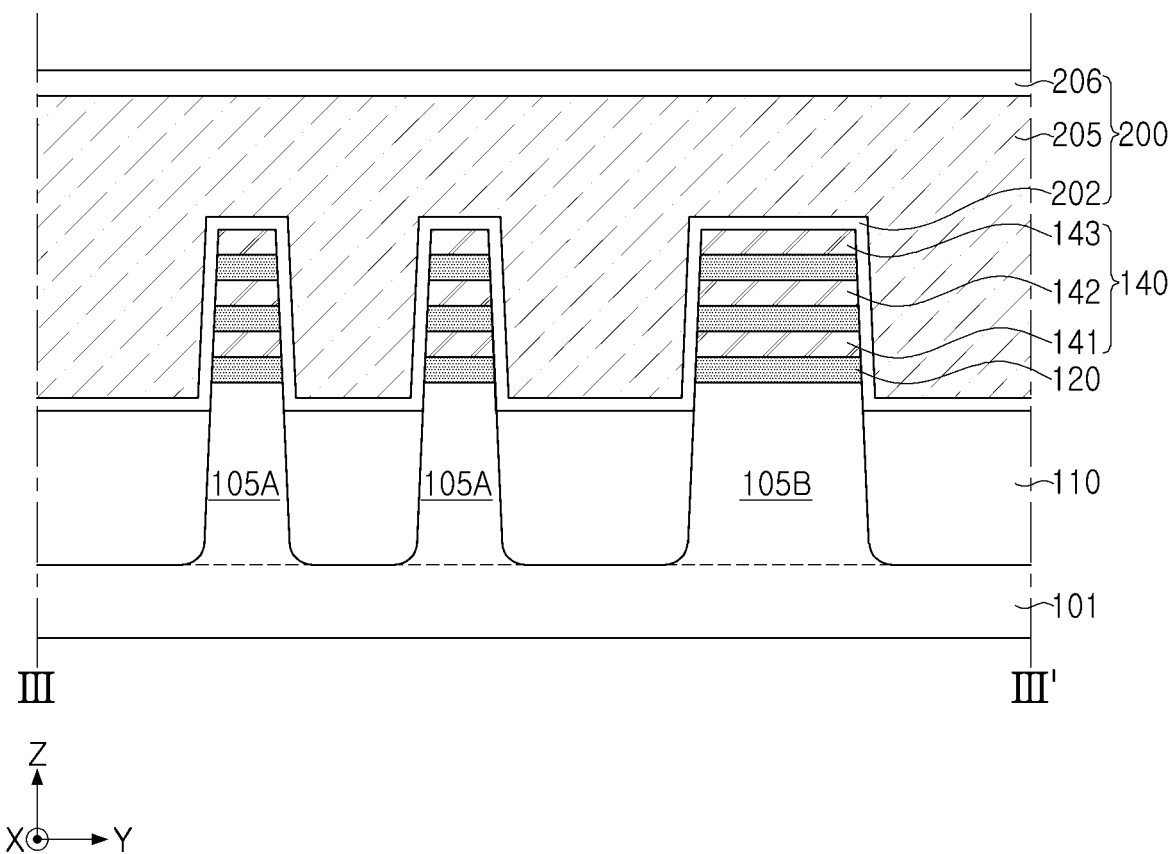

Referring to FIGS. 7A and 7B, recessed regions RC may be formed by partially removing the exposed sacrificial layers 120 and first to third channel layers 141, 142 and 143 from the outside of the sacrificial gate structure 200.

First, the recessed region RC may be formed by removing the exposed sacrificial layers 120 and the first to third channel layers 141, 142 and 143 by using the sacrificial gate structure 200 and the gate spacer layer 164 as masks. Accordingly, the first to third channel layers 141, 142 and 143 may form the channel structure 140 having a limited length in the X-direction.

Next, some of the sacrificial layers 120 may be removed. The sacrificial layer 120 may be selectively etched with respect to the channel structure 140 by, for example, a wet etching process, and removed to a predetermined depth from its side surfaces in the X-direction. The sacrificial layer 120 may have inwardly concave side surfaces by etching its side surfaces as described above. However, a specific shape of the side surface of the sacrificial layer 120 is not limited to that shown in FIG. 7A.

Figure 8A:
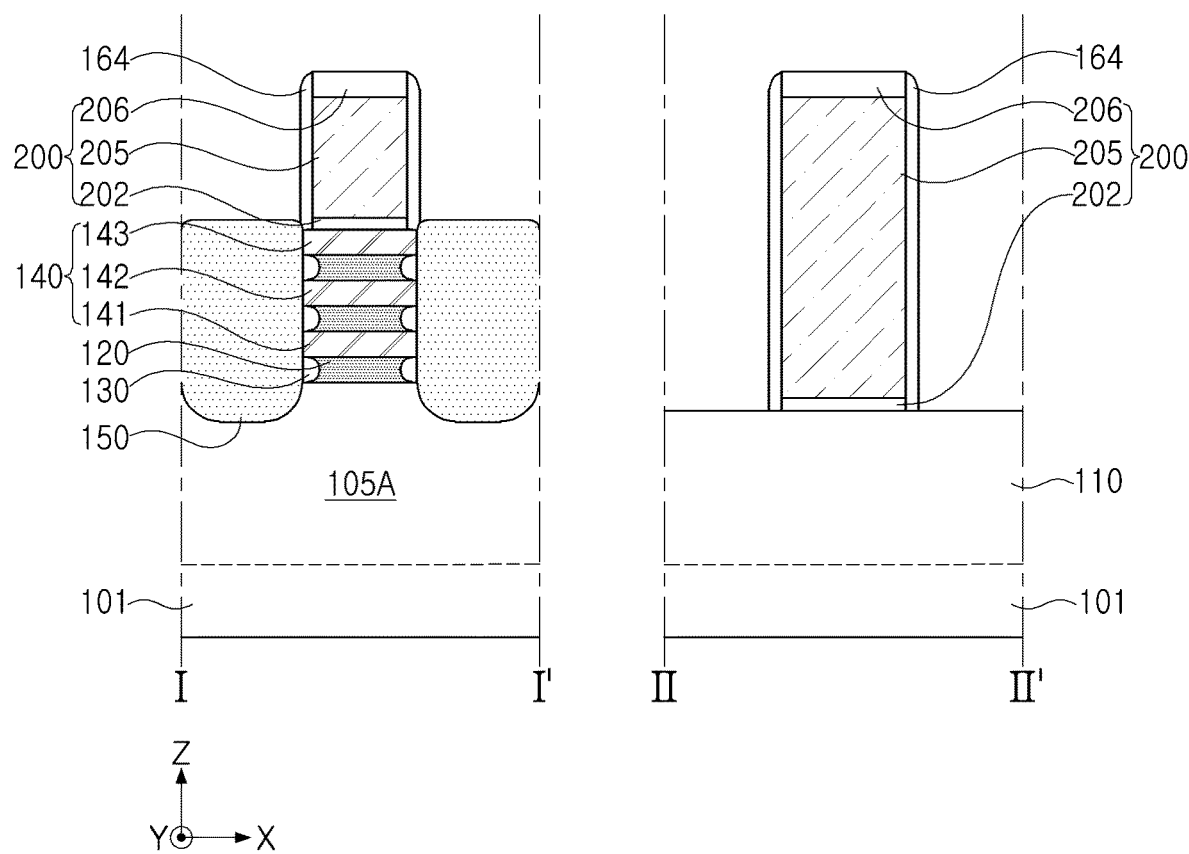
Figure 8B:
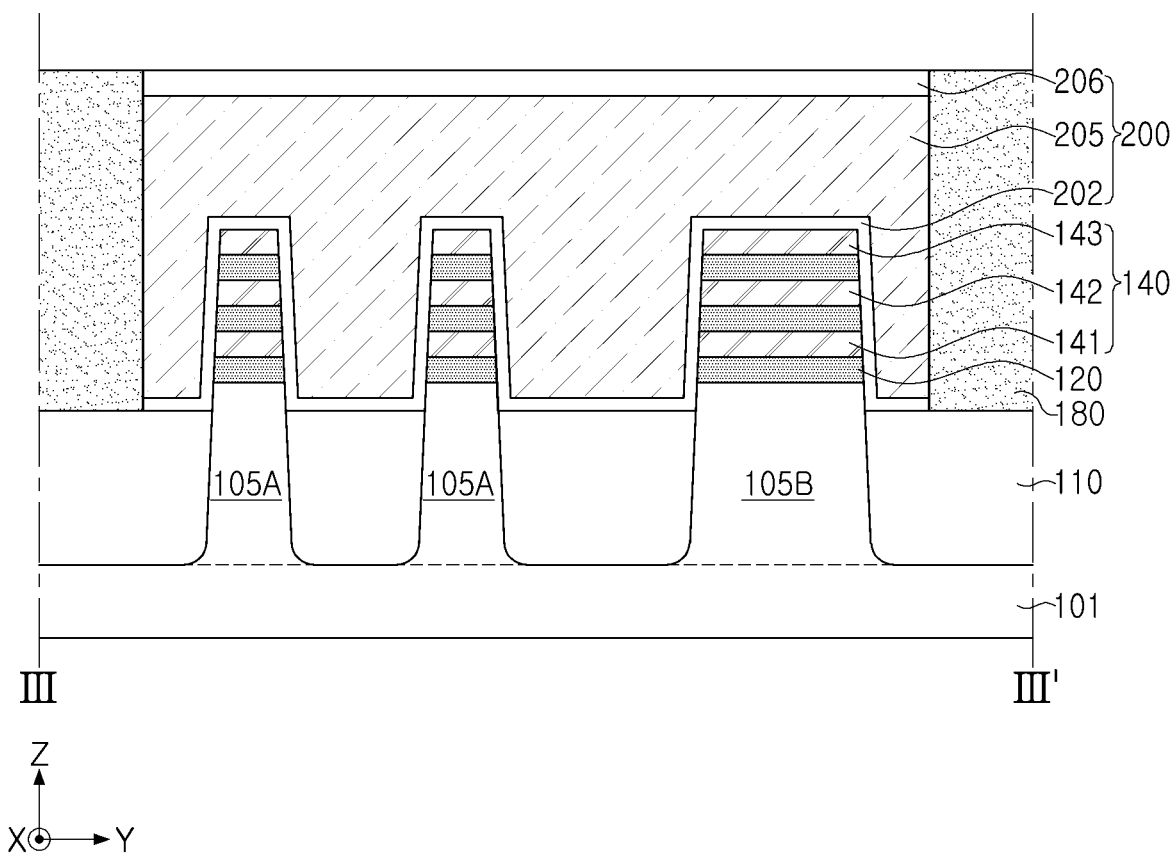

Referring to FIGS. 8A and 8B, the internal spacer layers 130, the source/drain regions 150 filling the recessed regions RC, and the gate separation layer 180 may be formed.

The internal spacer layer 130 may be formed in a region from which the sacrificial layer 120 is partially removed. The internal spacer layer 130 may be formed of the same material as the gate spacer layer 164, and is not limited thereto. For example, the internal spacer layer 130 may include at least one of silicon nitride (SiN), silicon carbonitride (SiCN), silicon oxycarbonitride (SiOCN), silicoboron carbonitride (SiBCN) and silicon boron nitride (SiBN).

Next, the source/drain region 150 may be formed by growing, for example, by a selective epitaxial process, from the upper surface of the active region 105 and the side surfaces of the channel structures 140. The source/drain region 150 may include the impurities by in-situ doping, and may include a plurality of layers having different doping elements and/or doping concentrations.

Next, the gate separation layer 180, which partially separates the sacrificial gate structure 200 in the Y-direction, may be formed. The gate separation layer 180 may be formed by partially removing the sacrificial gate structure 200 and depositing an insulating material. However, in some example embodiments, the gate separation layer 180 may be formed after forming the gate structure 160. In this case, the side surfaces of the gate separation layer 180, facing the gate structure 160, may not be entirely covered with the gate dielectric layer 162, and may also be in contact with the gate electrode 165.

Figure 9A:
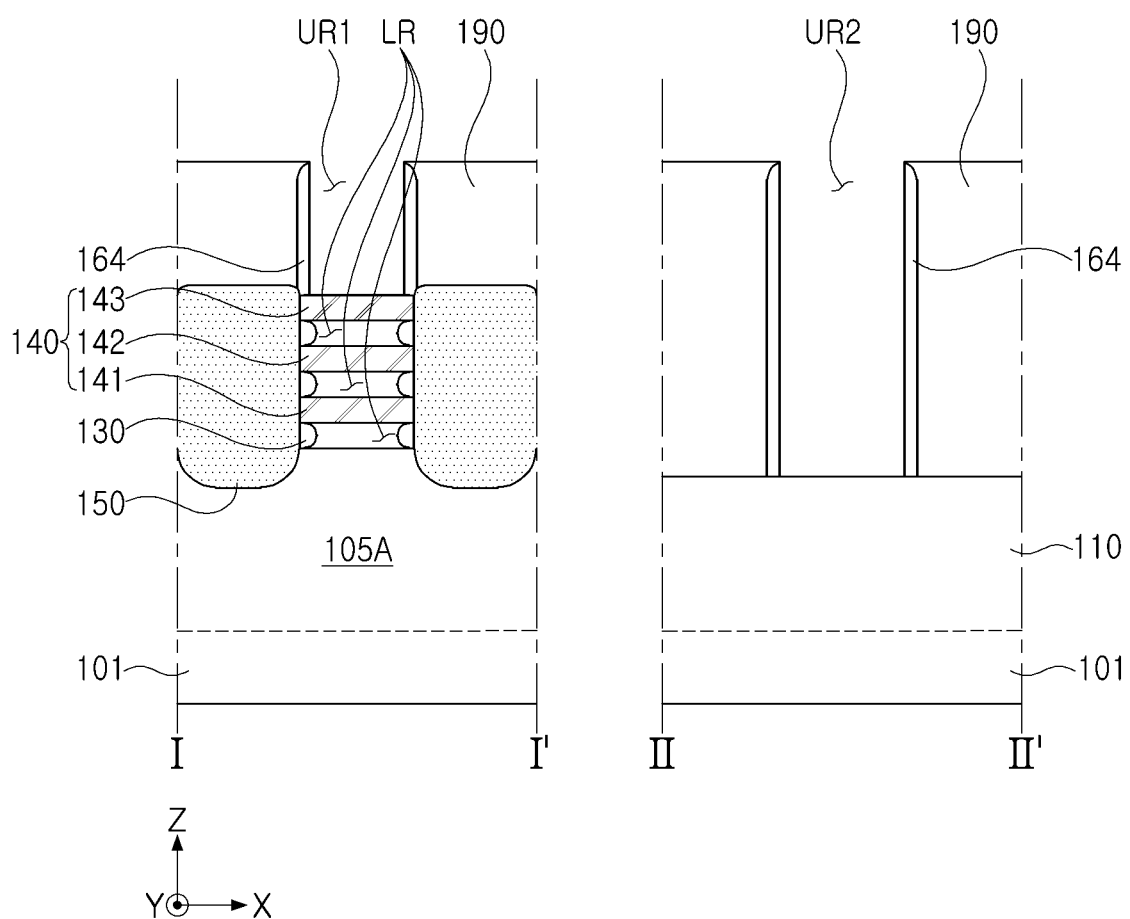
Figure 9B:
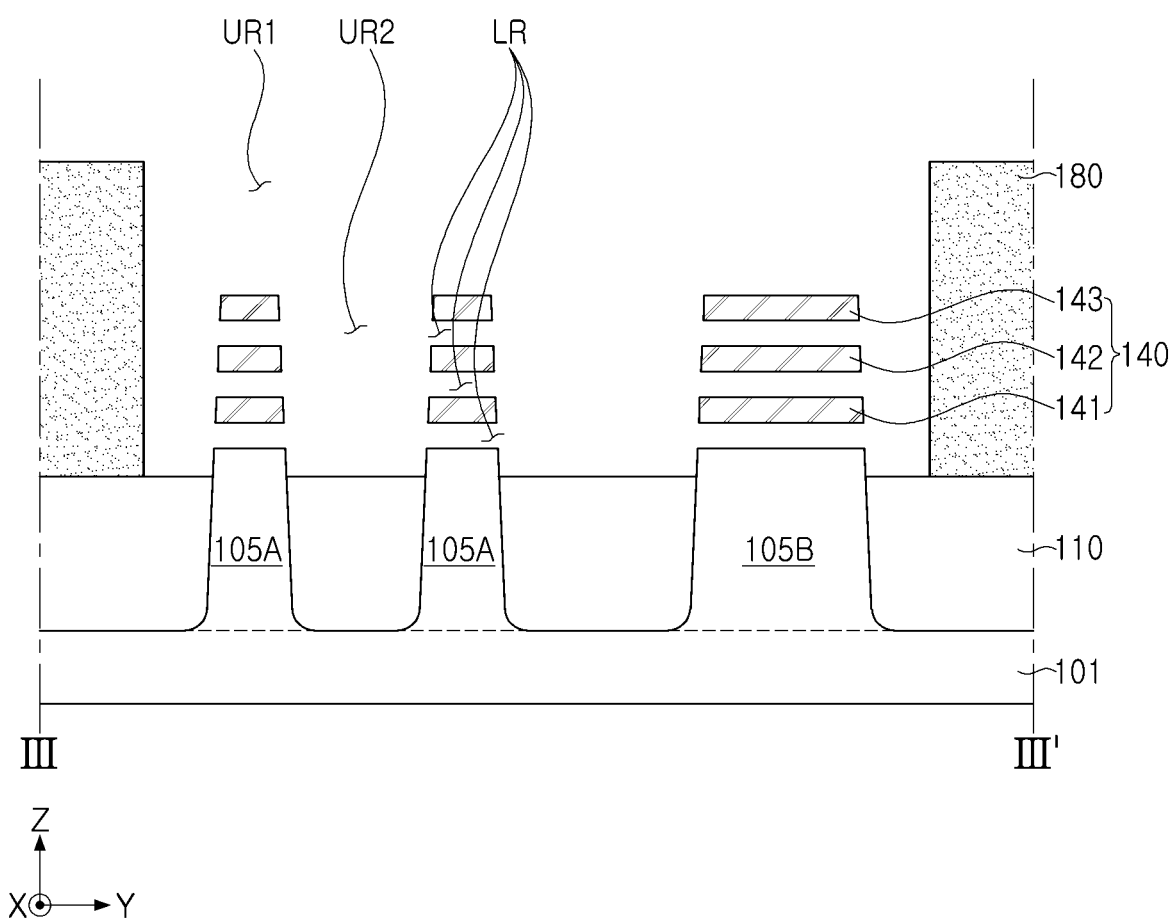

Referring to FIG. 9A and FIG. 9B, the sacrificial layers 120 and the sacrificial gate structure 200 may be removed after the interlayer insulation layer 190 is formed.

The interlayer insulation layer 190 may be formed by forming an insulating film on the sacrificial gate structure 200 and the source/drain region 150 and then performing a planarization process.

The sacrificial layers 120 and the sacrificial gate structure 200 may be selectively removed with respect to the gate spacer layer 164, the interlayer insulation layer 190 and the channel structure 140. First, the sacrificial gate structure 200 may be removed to form first and second upper gap regions UR1 and UR2, and the sacrificial layers 120 exposed through the first and second upper gap regions UR1 and UR2 may then be removed to form lower gap regions LR. The first upper gap region UR1 may be a region disposed on the channel structure 140, and the second upper gap region UR2 may be a region disposed on the element isolation layer 110. For example, when the sacrificial layer 120 includes silicon germanium (SiGe) and the channel structure 140 includes silicon (Si), the sacrificial layer 120 may be selectively removed by performing a wet etching process using a peracetic acid as an etchant. During the removal process, the source/drain region 150 may be protected by the interlayer insulation layer 190 and the internal spacer layers 130.

Figure 10A:
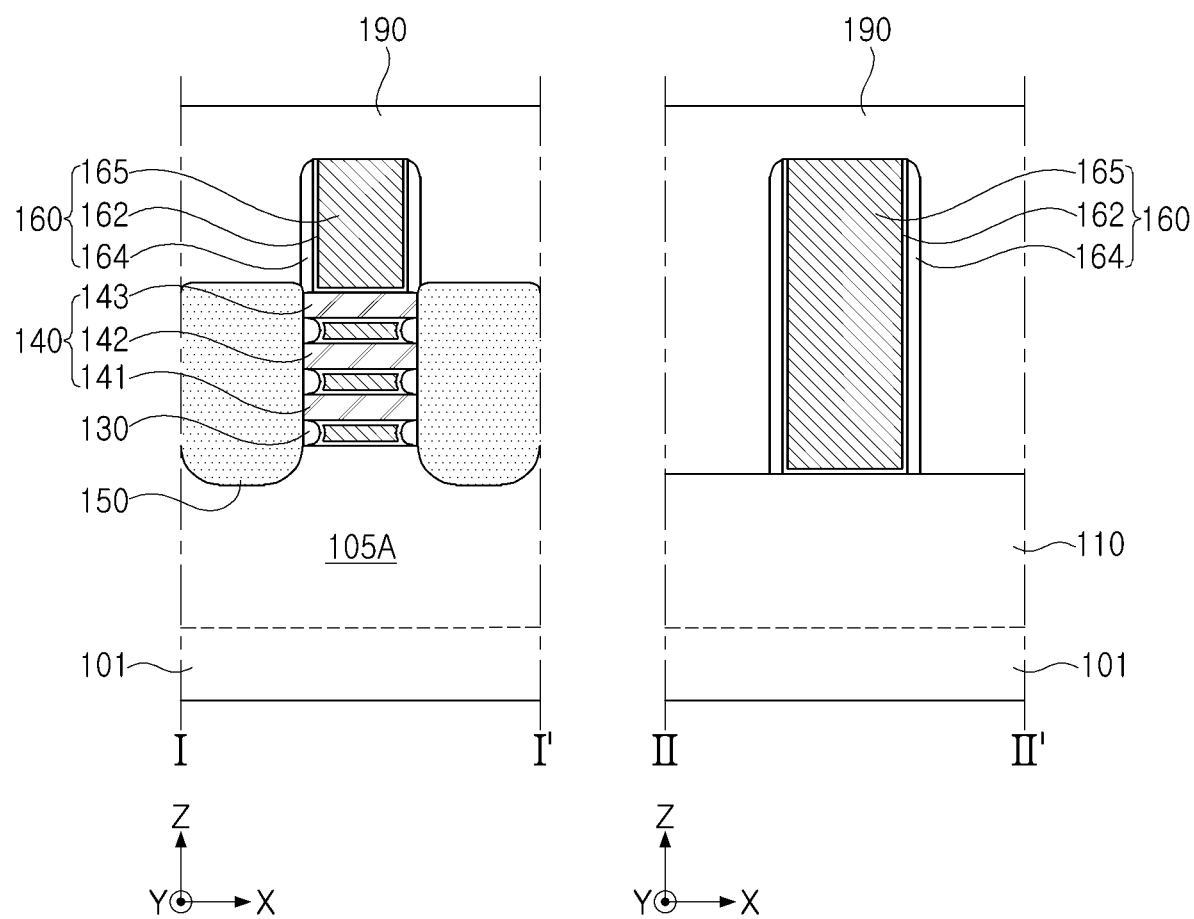
Figure 10B:
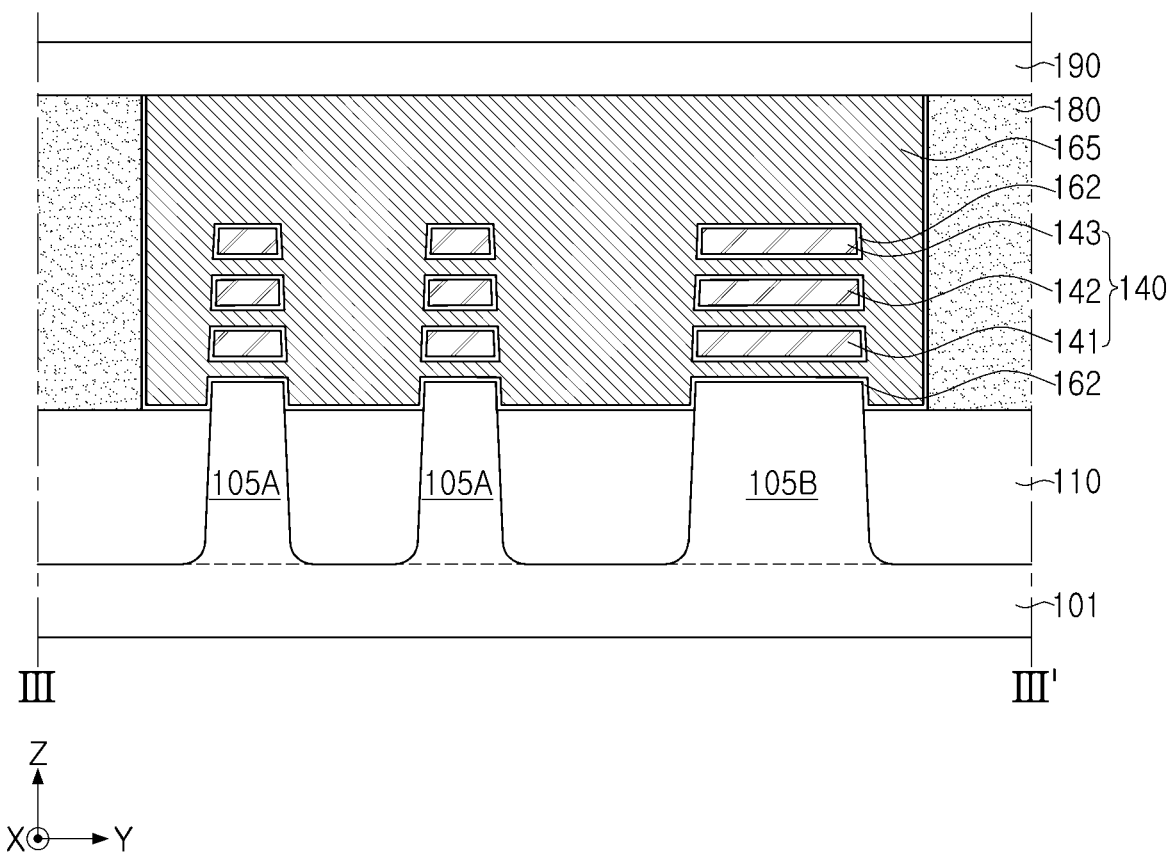

Referring to FIGS. 10A and 10B, the gate structure 160 may be formed.

The gate structure 160 may fill the first and second upper gap regions UR1 and UR2 and the lower gap regions LR. The gate dielectric layers 162 may conformally cover inner surfaces of the first and second upper gap regions UR1 and UR2 and the lower gap regions LR. The gate electrode 165 may be formed together with the gate dielectric layer 162 and the gate spacer layer 164 in such a manner that the first and second upper gap regions UR1 and UR2 and the lower gap regions LR are completely buried, and then be removed to a predetermined depth from its upper portion of the first and second upper gap regions UR1 and UR2. Accordingly, the gate structure 160 including the gate dielectric layer 162, the gate electrode 165 and the gate spacer layer 164 may be formed.

Next, the interlayer insulation layer 190 may be further formed on the gate structure 160.

Next, referring to FIG. 2A and FIG. 2B together, the contact plugs 195 may be formed.

The interlayer insulation layer 190 may be patterned to form a contact hole exposing the source/drain region 150. Next, the contact plug 195 may be formed by filling the contact hole with the conductive material. In detail, a material included in the barrier layer may be deposited in the contact hole, and a silicide process may then be performed to form a metal-semiconductor compound layer such as a silicide layer at its bottom end. Next, the conductive material may be deposited to fill the contact hole to form the contact plug 195. Accordingly, the semiconductor device 100 of FIGS. 1 through 2B may be manufactured.

Referring to FIGS. 11A and 11B together, it is shown that the first and second upper gap regions UR1 and UR2, as shown in FIGS. 9A and 9B. As shown in FIG. 11A, in a comparative example, the first length L1 of the first upper gap region UR1 and a second length L2" of the second upper gap region UR2 may be substantially the same as each other. On the other hand, as shown in FIG. 11B, according to example embodiments, the second length L2 of the second upper gap region UR2 may be greater than the first length L1 of the first upper gap region UR1. Accordingly, when the sacrificial layers 120 are removed, the etchant may be introduced through a relatively large space, and an introduced amount of the etchant may thus be increased, thereby completely removing the sacrificial layers 120 without any remaining portion. It is thus possible to prevent an occurrence of a defect caused by the remaining portion of the sacrificial layers 120. In addition, it is possible to relatively easily remove the sacrificial gate structure 200 even during a first process of removing the sacrificial gate structure 200.

Figure 12:
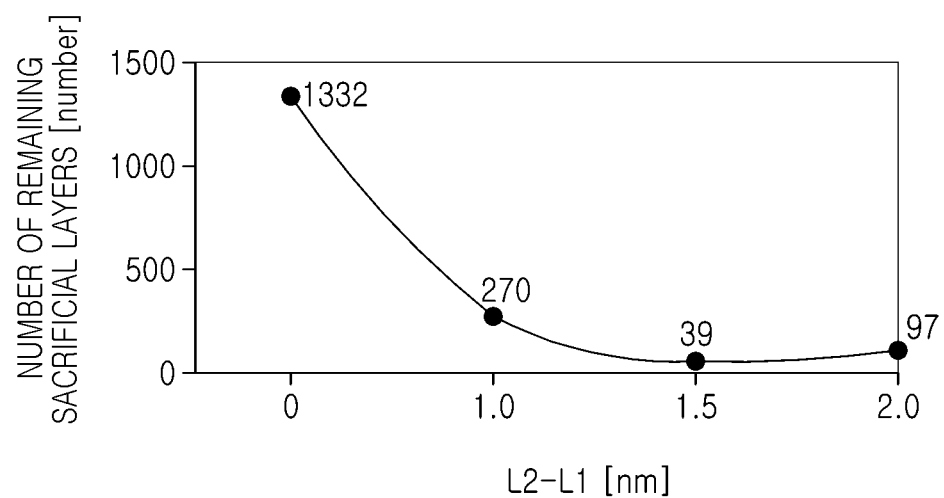
FIG. 12 is a graph for explaining a process characteristic according to example embodiments.

FIG. 12 is a graph for explaining a process characteristic according to example embodiments.

In particular, FIG. 12, shows a result of testing the remaining number of the sacrificial layers 120 based on a difference between the second length L2 and the first length L1 in FIGS. 1, 11A and 11B. Referring to FIGS. 9A and 9B, shown is the above-mentioned result of removing the sacrificial layers 120 in the comparative example in which the first length L1 is about 10.2 nm and the difference L2-L1 is zero (0) and in the inventive example in which the difference L2-L1 is 1.0 nm, 1.5 nm and 2.0 nm. The number of the remaining sacrificial layers 120 is 1332 in the comparative example, whereas the number is reduced to 270 when the difference L2-L1 is 1.0 nm and reduced to 39 when the difference L2-L1 is 1.5 nm. As such, when the difference L2-L1 is about 10% or more of the first length L1, the number of the remaining sacrificial layers 120 is reduced by about 20%. Accordingly, in example embodiments, the second length L2 may be selected in the range of about 1.1 times to about 1.3 times the first length L1.

As set forth above, it is possible to provide a semiconductor device with improved reliability by making the length of the gate electrode on the channel structure different from the length of the gate electrode on the outside of the channel structure in the MBCFET device.

While aspects of example embodiments have been shown and described above, it will be apparent to those skilled in the art that modifications and variations could be made without departing from the scope defined by the appended claims.

What is claimed is:

1. A semiconductor device comprising:
    a substrate comprising an active region extending in a first direction;
    an element isolation layer, adjacent to the active region, in the substrate;
    a gate electrode on the substrate and extending in a second direction which crosses the first direction;
    a plurality of channel layers on the active region, spaced apart from each other along a third direction perpendicular to an upper surface of the substrate, and surrounded by the gate electrode; and
    a source/drain region provided in a recess of the active region adjacent to the gate electrode, and connected to the plurality of channel layers,
    wherein, in the first direction, the gate electrode has a first length on the active region and a second length, greater than the first length, on the element isolation layer.

2. The semiconductor device of claim 1, wherein in a plan view, the gate electrode has a first side surface extending linearly in the second direction on the active region and a second side surface that convexly protrudes from the first side surface on the element isolation layer.

3. The semiconductor device of claim 2, wherein a boundary between the first side surface and the second side surface corresponds to a boundary between the active region and the element isolation layer.

4. The semiconductor device of claim 2, wherein a boundary between the first side surface and the second side surface is on the element isolation layer and spaced apart from a boundary between the active region and the element isolation layer.

5. The semiconductor device of claim 1, wherein the second length is in a range of about 1.1 times to about 1.3 times the first length.

6. The semiconductor device of claim 1, further comprising a gate spacer layer on a side of the gate electrode,
    wherein the gate spacer layer has a substantially constant length in the first direction on the active region and the element isolation layer.

7. The semiconductor device of claim 1, further comprising a gate dielectric layer between the active region and the gate electrode, and between the element isolation layer and the gate electrode,
    wherein, in the first direction, the gate dielectric layer has a third length on the active region and a fourth length, greater than the third length, on the element isolation layer.

8. The semiconductor device of claim 1, wherein an upper surface of the active region is farther from the upper surface of the substrate than an upper surface of the element isolation layer.

9. The semiconductor device of claim 1, wherein the gate electrode has the first length in the first direction in a region in which the gate electrode overlaps the plurality of channel layers in the third direction.

10. The semiconductor device of claim 1, wherein the plurality of channel layers do not overlap the element isolation layer in the third direction.

11. The semiconductor device of claim 1, wherein the gate electrode does not overlap the active region in the third direction in a region in which the gate electrode has the second length.

12. The semiconductor device of claim 1, further comprising a gate separation layer on a side of the gate electrode.

13. The semiconductor device of claim 1, further comprising a spacer layer between the gate electrode and the source/drain region.

14. A semiconductor device comprising:
    a substrate comprising an active region extending in a first direction;
    an element isolation layer, adjacent to the active region, in the substrate;
    a gate electrode on the substrate and extending in a second direction which crosses the first direction;
    a plurality of channel layers on the active region, spaced apart from each other along a third direction perpendicular to an upper surface of the substrate, and surrounded by the gate electrode,
    wherein in a plan view, the gate electrode has a convex side surface in a region in which the gate electrode overlaps the element isolation layer.

15. The semiconductor device of claim 14, wherein in the plan view, the gate electrode has a side surface extending linearly in the second direction in a region in which the gate electrode overlaps the active region.

16. The semiconductor device of claim 14, wherein the gate electrode has a symmetrical shape based on its center in the first direction.

17. The semiconductor device of claim 14, wherein in the first direction, the gate electrode has a first length in a region in which the gate electrode overlaps the active region in the third direction, and a second length, greater than the first length, in the region in which the gate electrode overlaps the element isolation layer.

18. The semiconductor device of claim 17, wherein the gate electrode comprises a plurality of regions having variable lengths in the first direction in the region in which the gate electrode overlaps the element isolation layer, and
wherein the second length is less than each of the variable lengths.

19. A semiconductor device comprising:
a substrate comprising an active region extending in a first direction;
a first gate structure on the substrate and extending in a second direction which crosses the first direction;
a second gate structure on the substrate and extending in the second direction;
a plurality of channel layers on the active region, spaced apart from each other along a third direction perpendicular to an upper surface of the substrate, and surrounded by each of the first gate structure and the second gate structure; and
a source/drain region on the active region between the first gate structure and the second gate structure, and connected to the plurality of channel layers,
wherein, in the first direction, the first gate structure has a first length on the plurality of channel layers, and a second length, greater than the first length, on the outside of the plurality of channel layers.

20. The semiconductor device of claim 19, wherein, in the first direction, the second gate structure has a third length on the plurality of channel layers, and a fourth length, substantially equal to the third length, outside of the plurality of channel layers.

* * * * *